(12) United States Patent
Wang et al.

(10) Patent No.: US 10,203,378 B1
(45) Date of Patent: Feb. 12, 2019

(54) POWER SOURCE CAPABILITY DETECTION

(71) Applicant: Amazon Technologies, Inc., Seattle, WA (US)

(72) Inventors: Thomas Gang Wang, San Jose, CA (US); Jesse Liang, Sunnyvale, CA (US); Hanh Thuy Phan, San Jose, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/008,333

(22) Filed: Jun. 14, 2018

Related U.S. Application Data

(63) Continuation of application No. 15/139,985, filed on Apr. 27, 2016, now Pat. No. 10,031,189.

(51) Int. Cl.
*G01R 31/40* (2014.01)
*G01R 19/165* (2006.01)
*G01R 19/25* (2006.01)

(52) U.S. Cl.
CPC ........... *G01R 31/40* (2013.01); *G01R 19/165* (2013.01); *G01R 19/2503* (2013.01)

(58) Field of Classification Search
CPC ..... G01R 31/34; G01R 31/343; G01R 31/346
See application file for complete search history.

(56) References Cited

U.S. PATENT DOCUMENTS

| | | | |
|---|---|---|---|
| 2010/0060257 A1* | 3/2010 | Azrai | G01R 19/0092 324/76.11 |
| 2010/0085087 A1* | 4/2010 | Dash | G01R 31/31721 327/143 |

* cited by examiner

*Primary Examiner* — Tung X Nguyen
(74) *Attorney, Agent, or Firm* — Lee & Hayes, PC

(57) ABSTRACT

This disclosure is directed to apparatuses, methods, and systems for detecting a capability of a power source connected to a device. For example, a device may include a standardized connector that may allow an unknown power source to provide power to the device. When a power source is connected with a device, a controller powers up and initiates power capability detection procedures. A ramping current sink begins drawing current from the power source at an initial value and increases that amount to a maximum current value. If a voltage on the device voltage bus falls below a voltage threshold during the ramping current sink operation, the current sink is disconnected and an indication is provided to the controller that the power source is underpowered. Further, a safety timer turns off the ramping current sink to prevent excessive heat generation.

20 Claims, 12 Drawing Sheets ously assigned, U.S. patent application Ser. No.
POWER SOURCE CAPABILITY DETECTION

CROSS REFERENCE TO RELATED APPLICATIONS

This is a continuation application which claims priority to commonly assigned, U.S. patent application Ser. No. 15/139,985, filed Apr. 27, 2016 now U.S. Pat. No. 10,031,189. Application Ser. No. 15/139,985 is fully incorporated herein by reference.

BACKGROUND

Electronic devices utilize internal and/or external power sources that provide power. These devices are configured to provide functions requiring a certain amount of power. When a required amount of power is not available, the device may not function correctly or may not function at all. Traditionally, proprietary connectors, such as barrel connectors, have been used to ensure a power requirement is met by a power source configured to couple with a specific electronic device. However, this limits the portability of electronic devices and requires users to use a dedicated power source for the electronic devices.

BRIEF DESCRIPTION OF THE DRAWINGS

The detailed description is described with reference to the accompanying figures. In the figures, the left-most digit(s) of a reference number identifies the figure in which the reference number first appears. The same reference numbers in different figures indicate similar or identical items.

DETAILED DESCRIPTION

Figure 1:
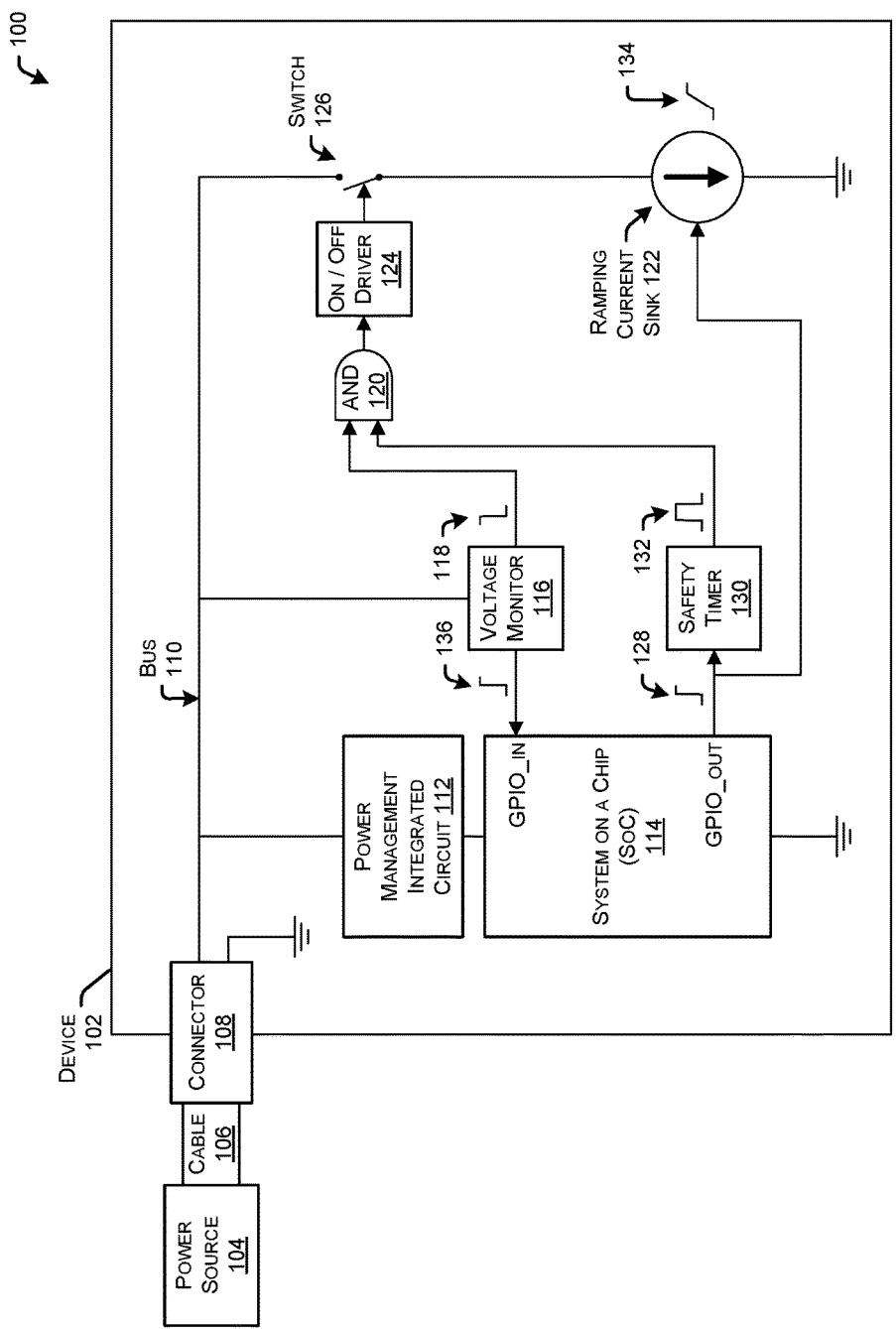
FIG. 1 shows a system including a functional block diagram of a device for detecting a power capability of a power source.

This disclosure describes apparatuses, methods, and systems for detecting a capability of a power source coupled to an electronic device. For example, the electronic device may utilize a standard power connector, such as a universal serial bus (USB), mini-USB, or micro-USB, etc., which in turn may allow a user to select from a variety of power sources. Among the various power sources capable of coupling with a standardized connector, there may be some variation in an amount of power supplied by an individual power source. For example, a first power source may be capable of supplying more than a required amount of power for the electronic device, while a second power source may not be capable of supplying the required amount of power. However, both the first and second power sources described above may be compliant with a specification associated with the standardized connector. Thus, detecting a capability of a power source becomes important to determine an available amount of power for the electronic device.

In some instances, the electronic device may include a circuit that detects a capability of a power source when the power source is coupled to the electronic device via a standardized cable. In general and without limitation, the circuit may include a system on a chip (SoC), a controller, and/or an integrated circuit, a voltage monitor, a ramping current sink controlled by an on/off driver, and a safety timer. For example, when a power source is connected to the electronic device, the SoC may receive power via a voltage bus and, when a minimum amount of power is supplied, the SoC may begin operations to detect a capability of a power source. The SoC may include operations, logic, instructions, etc. to control the power detection operations.

For example, when the SoC receives power, the SoC may initiate the detection procedure by sending a signal to trigger the safety timer and the ramping current sink. The ramping current sink can begin sinking (consuming) current at a first value and can gradually increase the amount of current through the current sink until maximum current is reached. In some instances, the ramping current sink may start from zero current draw and increase to a maximum preset value corresponding to (or higher than) a required amount of power for the electronic device to operate. In some instances the maximum preset value of current for the ramping current sink may be on the order of 1.5 amps. In some instances, although the term "ramping current sink" is used, a current sink may operate in any manner to sink various amounts of current.

The ramping current sink can be controlled by an on/off driver, which may disconnect the ramping current sink under two conditions. First, the on/off driver may be triggered to an "off" state when the safety timer expires. This limits the amount of time that the ramping current sink may sink current, which may prevent overheating. For example, because a ramping current sink may generate heat while dissipating power, the ramping current sink may increase in temperature during operation. Thus, the safety timer can ensure that the ramping current sink is only used for a duration of time such that thermal issues associated with sinking current are not a concern. As an additional benefit, limiting an amount of power consumed by the ramping current sink may obviate any need for a heat sink in the ramping current sink.

Second, the on/off driver may be triggered to an "off" state when a voltage of the bus falls below a threshold value. For example, the threshold value may be set at 4.5 volts, although any voltage value may be used as a threshold. In some instances, when the voltage of the bus (also referred to as a "bus voltage") falls below the threshold, an indication is provided to the SoC indicating that the power source is insufficient. In some instances, an indication is provided to the SoC including a voltage and/or current supplied by the power source, which may allow the SoC to determine more accurately an amount of power provided by a power source. Further, disconnecting the ramping current sink when the bus voltage falls below a threshold allows the circuitry to perform other operations including, but not limited to, providing an indication to a user that the power source capacity is insufficient, or restricting various functions of the electronic device to operate with an amount of power provided by the power source. In the event that the power source is capable of supplying the required power to the electronic device, the SoC may proceed with normal operations of a boot procedure.

In some instances, a switching current sink maybe used to sink current during the power source capability detection. The SoC may vary a duty cycle of a pulse-width modulation (PWM) signal, which in turn may drive one or more transistors connected to a load. As the duty cycle of the PWM increases, a correspondingly larger amount of current may be consumed by the load. A voltage of the bus can be detected using a voltage divider connected to an analog-to-digital converter (ADC) input of the SoC. Thus, the analog signal received by the SoC corresponds to the voltage of the bus during the power source capability detection operations. If the ADC input indicates that the voltage of the bus is below a threshold, the PWM may be disconnected and an indication may be provided that the power source is insufficient. If a maximum duty cycle is reached (corresponding to a maximum test load), the PWM may be disconnected and an indication may be provided that the power source capable of supplying the required power to the electronic device, and the SoC may proceed with normal operations of a boot procedure.

The apparatuses, methods, and systems described herein can be implemented in a number of ways. Example implementations are provided below with reference to the following figures.

FIG. 1 shows a system 100 including a device 102 for detecting a power capability of a power source 104. As shown in FIG. 1, the power source 104 is coupled to the device 102 via a cable 106 and a connector 108. In some instances, the connector may include any standardized cable connectors including, but not limited to, USB (Type-A, Type-B, Mini-A, Mini-B, Micro-A, Micro-B, Type-C, etc.), coaxial power connectors, snap and lock connectors such as Kycon 3-pin or 4-pin connectors, Molex connectors, Tamiya connectors, and/or any connectors in accordance with one or more IEEE specifications. The cable 106 may include any acceptable cables to interface with the power source 104 and the connector 108, including but not limited to shielded wires, unshielded wires, twisted or untwisted wire pairs, coaxial cables, ribbon cables, flat cables, etc. In some instances, the power source 104 may receive alternating current (e.g., 120 V/60 Hz) and may output direct current (DC) power. In some instances, the cable 106 may be removably coupled to the power source 104.

When the power source 104 is coupled to the device 102 via the cable 106 and the connector 108, the power source 104 supplies a voltage to a bus 110, which supplies power to the device 102. In some instances, and as explained in connection with FIG. 8, the device 102 is a voice-controlled device. In some instances, the power source converts alternating current (AC) to direct current (DC) to provide a voltage and a current to the device 102.

As explained herein, the device 102 may include a power management integrated circuit (PMIC) 112 coupled to a system on a chip (SoC) 114. The SoC 114 may include an integrated circuit or a controller configured to receive and transmit signals in accordance with the operations described herein. The PMIC 112 may include circuitry to maintain one or more constant voltage power rails supplied to the SoC 114. For example, the PMIC 112 may convert the voltage from the bus 110 (e.g., approximately 5 V for USB) to supply the SoC 114 with several constant, desired voltages (e.g., 3.3 V, 1.8 V, 1.2 V, 0.9 V, etc.). In some instances, when the power source 104 supplies a minimum amount of power to the device 102, the SoC 114 may turn on and initiate procedures described herein. In some instances, when the SoC 114 receives 100 mA of current, the SoC 114 may boot into a mini-kernel (e.g., logic or an operating system) which may begin the power capability detection operations.

In some instances, in response to the SoC 114 booting, or independent of the SoC 114, a voltage monitor 116 may receive power via the bus 110 and may output a signal 118 based on the voltage of the bus 110 (also referred to as V_BUS) relative to a threshold voltage. For example, the voltage monitor 116 may output a logical "high" signal 118 (i.e., a 5.0 V signal interpreted by logic as a binary "1", "on", or "high" signal, level, and/or value) when the voltage on the bus 110 is above 4.5 V. When the voltage on the bus 110 is below the threshold voltage, the voltage monitor 116 may output a logical "low" signal 118 (e.g., a 0 V signal interpreted by logic as a binary "0", "off", or "low" signal, level and/or value). As illustrated in FIG. 1, the signal 118 from the voltage monitor 116 may be input to a logical AND unit 120, which may control a ramping current sink 122 via an on/off driver 124 and a switch 126. In some instances, the logical AND unit 120 outputs a logical "high" (i.e., 5.0 V, or a voltage corresponding to a "high" signal), upon the presence of two "high" inputs, and outputs a logical "low" when one or both of the inputs is "low". In some instances, signals used herein may be active-high signals or active-low signals.

As described above, when the SoC 114 receives power the SoC 114 may initiate the power capability detection operations by outputting a trigger 128, which is received by the safety timer 130 and the ramping current sink 122. In some instances, the trigger 128 may be a GPIO_OUT (general-purpose input/output) "high" signal. In some instances, upon receiving the trigger 128, the safety timer 130 may output a pulse 132 (e.g., a "high" signal having definite start and end times), which is received by the logical AND unit 120. The pulse 132 may have an amplitude corresponding to the logic levels of the SoC 114, for example. The duration (i.e., width) of the pulse 132 can be set for a length of time to minimize thermal dissipation in the ramping current sink 122. For example, if the power capability detection operations are to be performed in 10 ms (milliseconds), the safety timer 130 may output a "high" pulse 132 for 10 ms (i.e., the pulse of the safety timer may remain active for 10 ms). In some instances, the safety timer 130 may output a "high" pulse 132 for 100 ms.

The logical AND unit 120 is configured to output a "high" signal to the on/off driver 124 when the signal 118 from the voltage monitor 116 is "high" and when the pulse 132 output by the safety timer 130 is "high" as well. That is, the logical AND unit 120 outputs a "high" signal when the voltage on the bus 110 is above a threshold value (or threshold voltage) for the time period controlled by the safety timer 130. In some instances, the logical AND unit 120 may control the on/off driver 124 (also referred to as a switch driver), which in turn may control the switch 126 and the ramping current sink 122.

In some instances, as power is supplied to the ramping current sink 122 (e.g., when the switch 126 is "on"), the ramping current sink 122 may start with zero current draw and ramp up to a maximum current draw. This ramping operation is illustrated as a ramp 134 in FIG. 1. In some instances, a starting current of the ramping current sink 122 may include a current above zero. In some instances, the ramping current sink 122 may increase a current linearly or non-linearly (e.g., logarithmically), depending on the implementation of the ramping current sink 122. In some instance, the ramping current sink 122 may increase a current stepwise, for example, by switching between discrete loads to vary a current draw.

In some instances, as the ramping current sink 122 increases an amount of current drawn from the power source 104, the voltage of the bus 110 may decrease and/or may collapse below the threshold voltage (e.g., 4.5 V) associated with the voltage monitor 116. In such a case, the voltage monitor 116 may output a signal 136 to the GPIO_IN of the SoC 114 to indicate this change in voltage. Similarly, when the voltage of the bus 110 falls below a threshold value, the voltage monitor 116 may output the signal 118 as a "low" signal, which, via the logical AND unit 120, the on/off driver 124, and the switch 126, turns off the ramping current sink 122. After the ramping current sink 122 is turned off, the voltage of the bus 110 may return to a target voltage (e.g., 5.0 V), as the ramping current sink 122 is no longer drawing current. Further, the SoC 114 may store an indication that the signal 136 was received (i.e., that the voltage of the bus 110 went below the threshold voltage during the power source capability detection operations). In some instances, the voltage monitor 116 may continue to output a "low" signal as the output 118 after detecting the voltage of the bus 110 below the voltage threshold and returning above the voltage threshold following a disconnection of the ramping current sink 122.

In some instances, the ramping current sink 122 may provide an indication to the SoC 114 of the instantaneous current drawn by the ramping current sink 122. Thus, the SoC 114 may determine a current drawn by the ramping current sink 122 when the voltage of the bus 110 drops below the threshold voltage of the voltage monitor 116, to determine a power capacity of the power source 104. In some instances, the SoC 114 may infer a current drawn by the ramping current sink 122 when the voltage collapses by determining a time between initiating the detection procedures and receiving the indication of the voltage collapse.

Figure 2A:
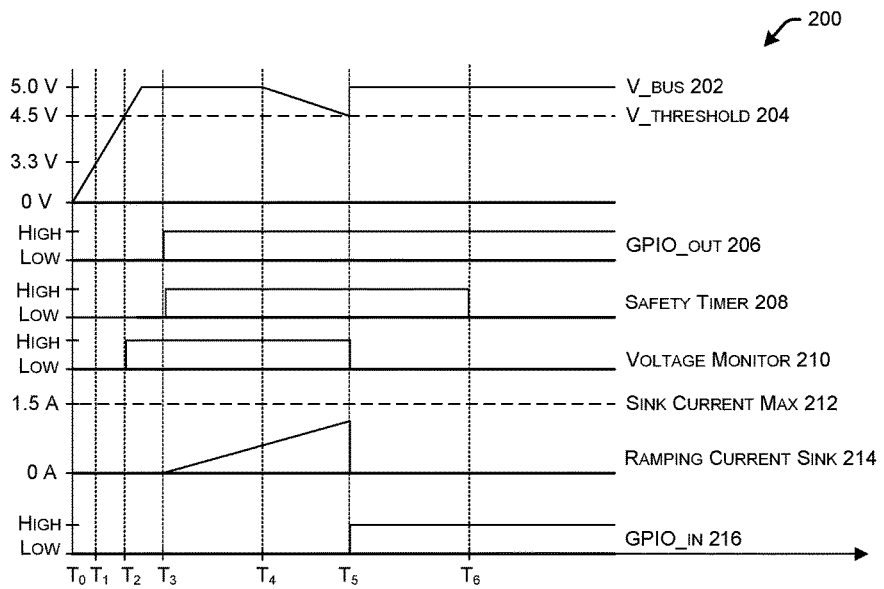
FIG. 2A is a conceptual timing diagram illustrating a process for detecting that a power capability of a power source is below a threshold amount.

FIG. 2A is a conceptual timing diagram 200 illustrating a process for detecting that a power capability of a power source is below a threshold amount. The specific illustrations in FIG. 2A are not intended to represent precise timings, voltages, and/or currents in a circuit, but are intended to illustrate the operations described herein. As illustrated, the diagram 200 includes a voltage V_BUS 202, a voltage V_THRESHOLD 204, a signal GPIO_OUT 206, a signal safety timer 208, a signal voltage monitor 210, a current sink current max 212, a current ramping current sink 214, and a signal GPIO_IN 216. In some instances, the voltage of the V_BUS 202 may correspond to the voltage of the bus 110 in FIG. 1. In some instances, the voltage V_THRESHOLD 204 may correspond to a threshold voltage set, determined, and/or monitored by the voltage monitor 116 in FIG. 1. In some instances the signal GPIO_OUT 206 may correspond to the GPIO_OUT 128 in FIG. 1. In some instances, the safety timer 208 may correspond to the safety timer 132 of FIG. 1. In some instances, the voltage monitor 210 may correspond to the signal 118 in FIG. 1. In some instances, the sink current max 212 may correspond to a maximum current sink by the ramping current sink 122 in FIG. 1, and the current represented by the ramping current sink 214 may correspond to the ramp 134 in FIG. 1. In some instances, the GPIO_IN 216 may correspond with the GPIO_IN 136 in FIG. 1. These signals, voltages, and currents vary over time, as explained below.

At $T_0$, which may correspond to an initial time, the device 102 is connected to a power source, such as the power source 104, for example, which energizes the circuit and applies a voltage to the V_BUS 202. At $T_1$, or a certain amount of time after $T_0$, a voltage and/or current is sufficient to power the SoC 114, for example, which powers up and initiates procedures to detect a capability of the power source 104. In some instances, the SoC 114 may power up before the V_BUS 202 is above the V_THRESHOLD 204. For example, in some instances, the SoC 114 may power up when the voltage of the V_BUS 202 is approximately 3.3 V.

At $T_2$, or a certain time after $T_1$, the voltage of the V_BUS 202 may cross above the voltage of the V_THRESHOLD 204. In some instances, in response to the V_BUS 202 crossing above the V_THRESHOLD 204, the signal voltage monitor 210 indicates that the voltage V_BUS 202 is above the V_THRESHOLD 204 (e.g., by setting the signal voltage monitor 210 to "high").

At $T_3$, or a time after $T_2$, the SoC 114 sets the signal GPIO_OUT 206 to "high", which triggers the safety timer 208 and/or the ramping current sink 214. For example, in some instances, the time $T_3$ is determined and/or set based on an amount of time required by the SoC 114 to boot a kernel and initiate the power source detection procedures. In some instances, the time $T_3$ is determined and/or set to allow a voltage on the V_BUS 202 to stabilize at a nominal voltage without a load. Thus, in some instances, at $T_3$, when the safety timer 208 is high and the voltage monitor 210 is high, the ramping current sink 214 may begin sinking current.

From $T_3$ to $T_4$, which may correspond to a time after $T_3$, the ramping current sink 214 increases an amount of current drawn. In some instances, based on a characteristic of the power source 104, there may be little or no voltage drop on the V_BUS 202. However, between $T_4$ and $T_5$ the current draw of the ramping current sink 214 may cause the V_BUS 202 to fall. At $T_5$, the V_BUS 202 may fall below the V_THRESHOLD 204. In response, the signal voltage monitor 210 may transition to "low", which disconnects the ramping current sink 214. Accordingly, with the current drawn by the ramping current sink 214 set to zero, the voltage V_BUS 202 returns to a nominal value (e.g., 5.0 V in some instances). Also at $T_5$, the voltage V_BUS 202 falling below the voltage V_THRESHOLD 204 triggers the signal GPIO_IN 216 to "high", which provides an indication to the SoC 114 that the power capacity of the power source 104 is below a threshold power capacity, which may indicate that the power source 104 is insufficient to provide a required amount of power to the device 102. At $T_6$, which may correspond to a time after $T_5$, the safety timer 208 expires.

Figure 2B:
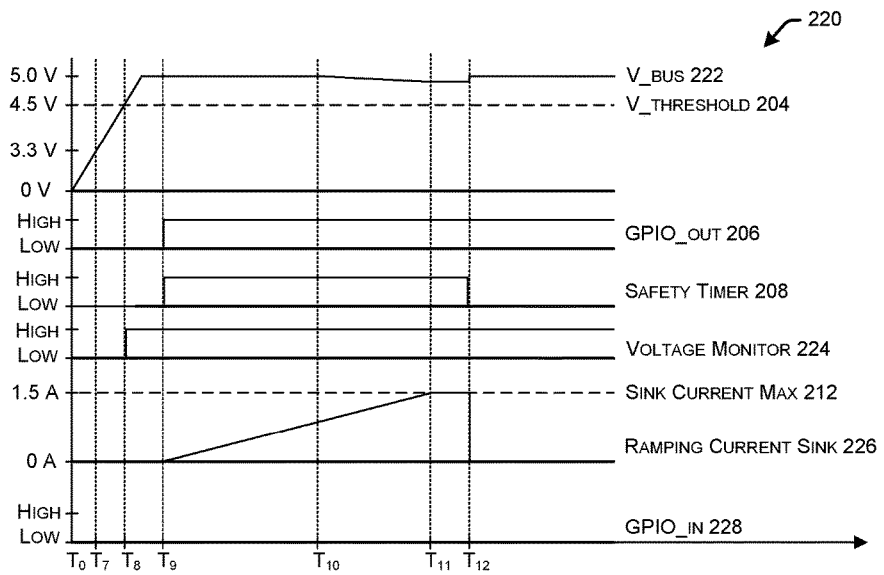
FIG. 2B is a conceptual timing diagram illustrating a process for detecting that a power capability of a power source is above a threshold amount.

FIG. 2B is a conceptual timing diagram 220 illustrating a process for detecting that a power capability of a power source is above a threshold amount. The specific illustrations in FIG. 2B are not intended to represent precise timings, voltages, and/or currents in a circuit, but are intended to illustrate the operations described herein. Similar names of the signals, voltages, and currents between FIGS. 2A and 2B correspond to similar operations; however, as described below, the power source represented in FIG. 2B is capable of supplying power above a threshold power level, which may indicate that the power source is capable of supplying power to an electronic device, such as the device 102.

At $T_0$, which may correspond to an initial time, the device 102 is connected to a power source (capable of supplying a required power). At $T_7$, which may correspond to a time after $T_0$, the SoC 114 is energized and initiates operations to detect the capabilities of the power source.

At $T_8$, which may correspond to a time after $T_7$, a signal voltage monitor 224 indicates whether the V_BUS 222 is above the V_THRESHOLD 204. At $T_9$, which may correspond to a time after $T_8$, the SoC 114 may finish booting and/or the voltage on the bus V_BUS 22 may stabilize, and the signal GPIO_OUT 206 is output by the SoC 114, triggering the safety timer 208 and/or a ramping current sink 226.

Between $T_9$ and $T_{10}$, which may correspond to a time after $T_9$, the voltage represented by the V_BUS 222 remains steady at a nominal value (in this case, 5.0 V), while between $T_{10}$ and $T_{11}$ (which may which may correspond to a time after $T_{10}$), the increasing current draw of a ramping current sink 226 may pull down the voltage of the V_BUS 222. At $T_{11}$ the ramping current sink 226 reaches a maximum current draw (e.g., the sink current max 212), and the voltage of the V_BUS 222 steadies at a voltage above the V_THRESHOLD 204. At $T_{12}$, which may correspond to a time after $T_{11}$, the safety timer 208 expires, disconnecting the ramping current sink 226, which sends the current to zero. A signal GPIO_IN 228 remains "low" because the voltage monitor 224 did not indicate that the voltage of the V_BUS 222 was less than the voltage of the V_THRESHOLD 204. Following $T_{12}$, the SoC 114 may continue a boot process of the device 102 without restrictions.

In some instances, the ramping current sink 226 may not reach a steady state current (e.g., the maximum current between $T_{11}$ and $T_{12}$, as illustrated). Instead, the width of the safety timer 208 and the rate of change of the ramping current sink 226 may be set such that the ramping current sink 226 is disconnected before the sink current max 212 is reached. In some instances, the ramping current sink 214 and 226, may not include a linear current increase, and a rate of change of the current may decrease as the current of the ramping current sink 226 approaches the maximum current. As illustrated, the maximum current (i.e., sink current max 212) of the ramping current sink 214 and 226 is 1.5 A, although other values may be used instead.

Figure 3:
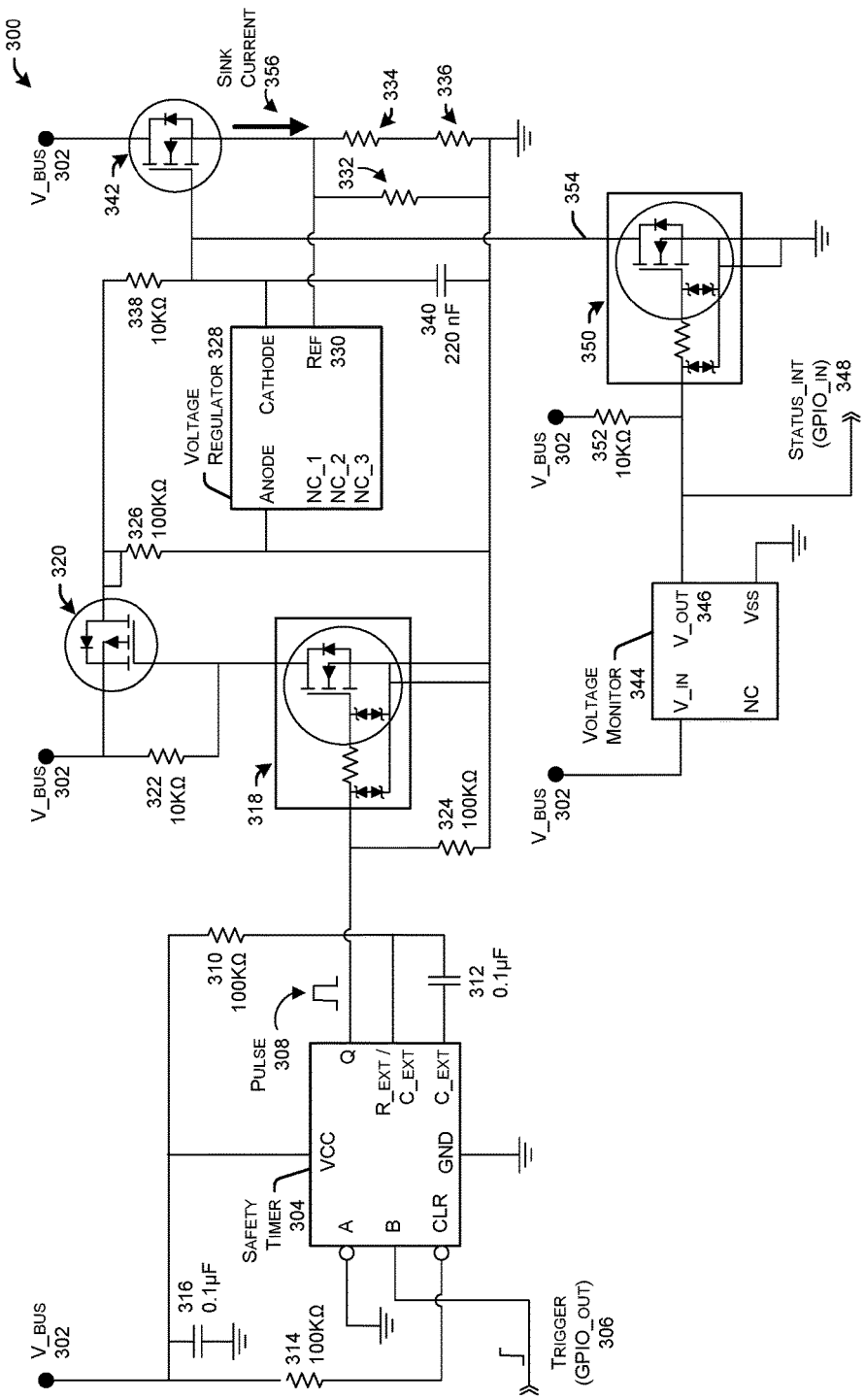
FIG. 3 shows an illustrative architecture of a device for detecting a power capability of a power source.

FIG. 3 shows an illustrative architecture 300 of a device for detecting a power capability of a power source. The components of the architecture 300 receive a voltage V_BUS 302, which may correspond to the voltage on the bus 110 of FIG. 1.

The architecture 300 comprises a safety timer 304, which may receive a trigger 306 as input and provide a pulse 308 as output. In some instances, the safety timer 304 comprises a single retriggerable (or non-retriggerable) monostable multivibrator with Schmitt trigger inputs. In some instances, the safety timer 304 may be implemented in a circuit with a component identified by a component number 74LVC1G123GN. In some instances, the pulse width of the pulse 308 may be set via a resistor 310 and a capacitor 312. In some instances, a resistor 314 may be coupled with a $\overline{CLR}$ input (i.e., NOT clear input) of the safety timer 304, such that the safety timer may reset when the V_BUS 302 goes to zero, but is prevented from reset while the V_BUS 302 is high. In some instances, a capacitor 316 may be situated between V_BUS 302 and ground (e.g., 0 V) to filter out transient signals in the bus voltage.

In some instances, the pulse 308 may correspond to the pulse 132 in FIG. 1. Thus, when the pulse 308 expires, a ramping current sink is turned off to prevent overheating of the circuit. In some instances, and as explained below, the ramping current sink can be represented as a sink current 356.

The architecture 300 further comprises transistors 318 and 320 that collectively function, in part, as an on/off switch for a ramping current sink, as discussed in FIG. 1. For example, the pulse 308 when "high" may turn on the transistor 318, which in turn may turn on the transistor 320. In some instances, the transistor 318 comprises an N-channel MOSFET (metal-oxide-semiconductor field-effect transistor), such as one with a component number Si8800EDB. In some instances, the transistor 320 comprises a P-channel MOSFET, such as one with a component number Si8425DB. Further, the transistors 318 and 320 are coupled to various resistors 322, 324, and 326 to bias aspects of the transistors 318 and 320, respectively.

The architecture 300 further comprises a voltage regulator 328, which contributes to setting a maximum current of the ramping current sink (i.e., the sink current 356), as discussed in FIG. 1. For example, an output voltage 330 of the voltage regulator 328, in combination with resistors 332, 334, and 336, set a maximum current of the ramping current sink. In some instances, the resistors 332, 334 and 336 are sized to provide 1.4 A at the reference voltage 330. In some instances, the voltage regulator 328 maybe implemented with a component identified using a component number TL431AIDCKT.

In some instances, a resistor 338 and a capacitor 340 collectively form a RC circuit (resistor-capacitor circuit) which charges in response to being triggered by the pulse 308, for example. The resistor 338 and the capacitor 340 are coupled with a transistor 342, which is turned on as the RC circuit charges. In some instances, the transistor 342 may comprise an N-channel MOSFET, such as one with a component number IRLML2502. In some instances, the transistor 342 is selected to be able to handle a maximum current, while in some instances, the transistor 342 is selected for having a low on-resistance, such that there is minimal voltage drop across the transistor 342 when turned on. As the RC circuit (corresponding to the resistor 338 and the capacitor 340) charges, the voltage at the gate of the transistor 342 increases, thereby increasing an amount of the sink current 356, for example.

The architecture 300 further comprises a voltage monitor 344, which may monitor a voltage of the V_BUS 302 to determine if the voltage is falling below a voltage threshold. In some instances, the voltage monitor 344 may correspond to the voltage monitor 116 in FIG. 1. In some instances, a threshold voltage is set internally by the voltage monitor 344, while in some instances, the threshold voltage may be set by an external circuit. In some instances, the voltage monitor 344 is selected such that the response time of the voltage monitor 344 is significantly faster than the operation of the ramping current sink. For example, if the operations of the ramping current sink are to be performed over a period of 10 ms or 100 ms (milliseconds), the voltage monitor 344 may be selected with a response time on the order of 100 μs (microseconds) or lower. In some instances, the voltage monitor 344 comprises a component with a series number XC6126.

Within the voltage monitor 344, when the V_BUS 302 is above a threshold voltage, the output voltage V_OUT 346 outputs a "low" signal 348, which is labeled as "STATUS_INT" (i.e., status interrupt), which may correspond to GPIO_IN 136 of FIG. 1. The signal 348 is provided as an input to a transistor 350, which is biased by a resistor 352. In some instances, the transistor 350 comprises an N-channel MOSFET, such as one with a component number Si8800EDB. As the signal 348 remains "low" (corresponding to V_BUS 302 above a threshold voltage), the transistor 350 remains in an "off" state. When the V_BUS 302 goes below a threshold voltage, the voltage monitor 344 outputs a "high" signal 348, which turns on the transistor 350, which turns off the transistor 342 (effectively sending the sink current 356 (i.e., the ramping current sink) to zero). Thus, a voltage 354 at the drain of the transistor 350 conceptually corresponds to the signal 118 of FIG. 1. That is, when the V_BUS 302 is above a threshold voltage, the transistor 350 remains off, and the drain voltage 354 of the transistor 350 will depend on the RC circuit formed by the resistor 338 and the capacitor 340. However, when the transistor 350 turns on, the drain voltage 354 of the transistor 350 will be low, effectively shutting off the ramping current sink.

In some instances, the output of the voltage monitor 344 is a latched output, such that after the signal 348 is set to "high" and the ramping current sink is turned off, when the voltage of the V_BUS 302 increases above the threshold voltage (as a result of turning the ramping current sink off), the signal 348 does not change states until the voltage monitor 344 is reset. That is, in some instances, the ramping current sink is not turned on again after the voltage monitor 344 has detected the V_BUS 302 below a threshold voltage. However, when a user unplugs the power source 104 from the device 102, for example, and couples the same or different power source with the device 102, the latched output of the voltage monitor 344 may reset and the capability detection operations may be repeated.

A variety of devices may be used within the architecture 300. For example, components are not limited to those expressly described above, and various components may substituted or replaced for alternate implementations. For example, N-channel and P-channel MOSFETS may be used where appropriate. In some instances, various devices may be used, such as switching diodes, SCRs (silicon-controlled rectifiers), BJTs (bipolar junction transistors), JFETs (junction gate field-effect transistors), etc., according to current and/or voltage requirements of a specific implementation. Further, various resistor values and capacitance values illustrated in FIG. 3 are exemplary and the resistors and capacitors are not limited to those discussed above.

Figure 4:
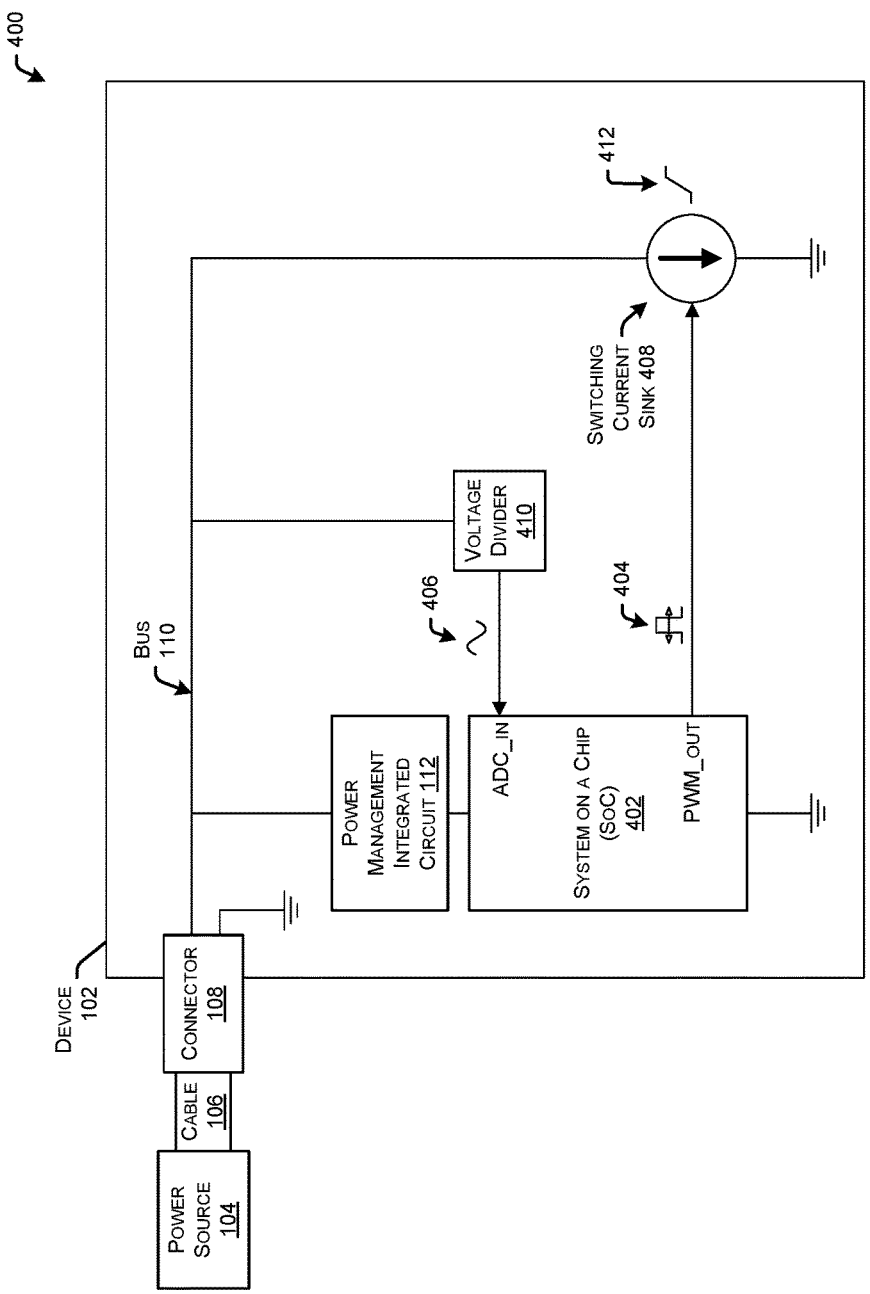
FIG. 4 shows another system including a functional block diagram of a device for detecting a power capability of a power source.

FIG. 4 shows another system 400 including a functional block diagram of a device for detecting a power capability of a power source 104. As shown in FIG. 4, the power source 104 is coupled to the device 102 via a cable 106 and a connector 108. Similar to the system 100 illustrated in FIG. 1, the power source may provide a voltage to the bus 110, which in turn may energize the power management integrated circuit 112 and a system on a chip (SoC) 402. In some instances, the SoC 402 may correspond to the SoC 114 of FIG. 1. In some instances, described herein, the SoC 402 may provide a PWM_OUT 404 and may receive an analog-to-digital converter (ADC) input 406. Further, the system 400 may include a switching current sink 408 receiving the PWM_OUT 404, and may include a voltage divider 410 providing the ADC input 406 to the SoC 402.

In some instances, when the power source 104 supplies a minimum amount of power to the device 102, the SoC 402 may turn on and initiate procedures described herein. In some instances, when the SoC 402 receives 100 mA of current (or the like), the SoC 402 may boot into a mini-kernel (e.g., logic or an operating system) which may begin the power capability detection operations. For example, the SoC 402 may output the PWM_OUT 404 to the switching current sink 408 to cause the switching current sink 408 to sink (i.e., draw or consume) current at an initial value. SoC 402 may vary the duty cycle (e.g., a percentage of time in which the signal is active or "high") of the PWM_OUT 404 to gradually increase a current of the switching current sink 408 (illustrated as a ramp 412) from an initial value to a maximum value, corresponding to power values of the power source 104 to be tested.

In some instances, the PWM_OUT 404 is a pulse-width modulation signal generated and output by the SoC 402 having a particular frequency and duty cycle. For example, the PWM_OUT 404 may vary a duty cycle from 1% to 20% during the testing operations described herein. In some instances, a frequency of the PWM_OUT 404 may be on the order of 8 kHz, 16 kHz, 32 kHz, or another value, and the frequency may selected such that the frequency is higher than a transient response time of a particular power source to be tested. In some instances, the PWM_OUT 404 may include a fixed-width modulation (FWM) signal or a pulse density modulation (PDM) signal.

In some instances, the SoC 402 outputs the PWM_OUT 404 at a first duty cycle, which generates a first switching current sink at a first time. This applies a load to the power source 104, which may cause a voltage of the bus 110 to drop, depending on the characteristics of the power source 104. In some instances, the voltage divider 410 divides (i.e., reduces) the voltage of the bus 110 and provides that voltage to the SoC 402 as the signal ADC_IN 406. The SoC 402 monitors the ADC_IN 406 and determines if the voltage on the bus 110 is above a threshold value. In some instances, the threshold value can be determined dynamically by the SoC 402 (i.e., the threshold value may not depend on hardware of the system 400, and may be set or tuned in software according to tolerances in circuit hardware, for example, of the SoC 402.

If the voltage of the bus 110 remains above a threshold value, the SoC 402 may increase a duty cycle of the PWM_OUT 404, which may cause the switching current sink 408 to draw additional current. The SoC 402 may continue to monitor the voltage of the bus 110 via the ADC_IN 406 until the ADC_IN 406 indicates that the voltage of the bus 110 has fallen below a threshold value, or the PWM_OUT 404 has reached a maximum duty cycle. In the event of a voltage collapse, the SoC 402 may determine a power capacity of the power source 104 based in part on the duty cycle of the PWM_OUT 404 at the time of collapse and the voltage threshold, where the duty cycle corresponds to the current drawn by the switching current sink 408 at the time of collapse.

Figure 5A:
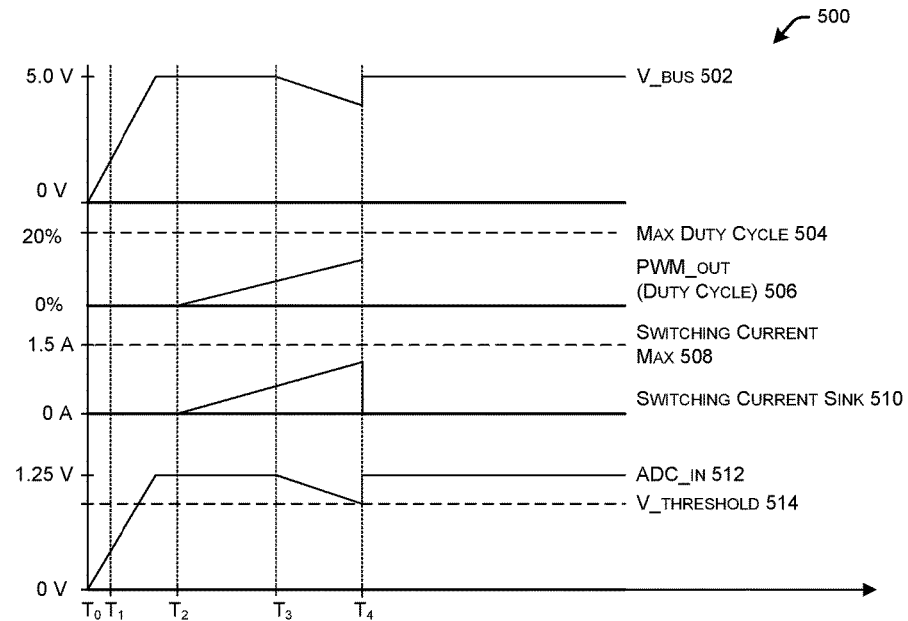
FIG. 5A is a conceptual timing diagram illustrating a process for detecting that a power capability of a power source is below a threshold amount using a switching current sink.

FIG. 5A is a conceptual timing diagram 500 illustrating a process for detecting that a power capability of a power source is below a threshold amount using a switching current sink. The specific illustrations in FIG. 5A are not intended to represent precise timings, voltages, and/or currents in a circuit, but are intended to illustrate the operations described herein. As illustrated, the diagram 500 includes a voltage V_BUS 502, a maximum duty cycle 504, a PWM_OUT 506 corresponding to an instantaneous duty cycle, a switching current max 508, a switching current sink 510, a voltage ADC_IN 512, and a voltage V_THRESHOLD 514. In some instances, the voltage of the V_BUS 502 may correspond to the voltage of the bus 110 in FIG. 4. In some instances, the max duty cycle 504 may correspond to a maximum duty cycle set, determined, and/or monitored by the SoC 402 in FIG. 4. In some instances the signal PWM_OUT 506 may correspond to the PWM_OUT 404 in FIG. 4. In some instances, the switching current max 508 may correspond to a maximum current sink by the switching current sink 408 in FIG. 4, and the current represented by the switching current sink 510 may correspond to the ramp 412 in FIG. 4. In some instances, the signal ADC_IN 512 may correspond to the ADC_IN 406 in FIG. 4. In some instances, the voltage V_THRESHOLD 514 may correspond to a threshold voltage set, determined, and/or monitored by the SoC 402 in FIG. 4. These signals, voltages, and currents vary over time, as explained below.

At $T_0$, which may correspond to an initial time, the device 102 (e.g., in FIG. 4) is connected to a power source, such as the power source 104, for example, which energizes the circuit and applies a voltage to the V_BUS 502. At $T_1$, or a certain amount of time after $T_0$, a voltage and/or current is sufficient to power the SoC 402, for example, which powers up and initiates procedures to detect a capability of the power source 104. For example, in some instances, the SoC 402 may power up when the voltage of the V_BUS 502 is approximately 3.3 V.

At $T_2$, or a certain time after $T_1$, the voltage of the V_BUS 502 may cross above a voltage corresponding to the V_THRESHOLD 514. In some instances, for example, in response to SoC 402 booting into a kernel to initiate the detection procedures and/or after the voltage of the V_BUS 502 stabilizes, the SoC 402 may begin outputting the PWM_OUT 506. The PWM_OUT 506 may be output at a first duty cycle and the duty cycle may be increased in a manner to increase the current drawn by the switching current sink 510. While the PWM_OUT 506 is varying the duty cycle, the SoC 402 monitors a voltage ADC_IN 512, which corresponds to the voltage on the V_BUS 502.

From $T_2$ to $T_3$, which may correspond to a time after $T_2$, the switching current sink 510 increases an amount of current drawn. In some instances, based on a characteristic of the power source 104, there may be little or no voltage drop on the V_BUS 502. However, between $T_3$ and $T_4$ the current draw of the switching current sink 510 may cause the V_BUS 502 to fall. At $T_4$, the ADC_IN 512 may fall below the V_THRESHOLD 512 (which indicates that the V_BUS 502 has fallen below a threshold). In response, the SOC 402 may discontinue the PWM_OUT 506, which discontinues the operation of the switching current sink 510. Further, at $T_4$, the SoC 402 may store an indication that the power source is insufficient and/or may store an indication of the duty cycle of the PWM_OUT 506 at which the voltage ADC_IN 512 fell below the voltage V_THRESHOLD_514.

Figure 5B:
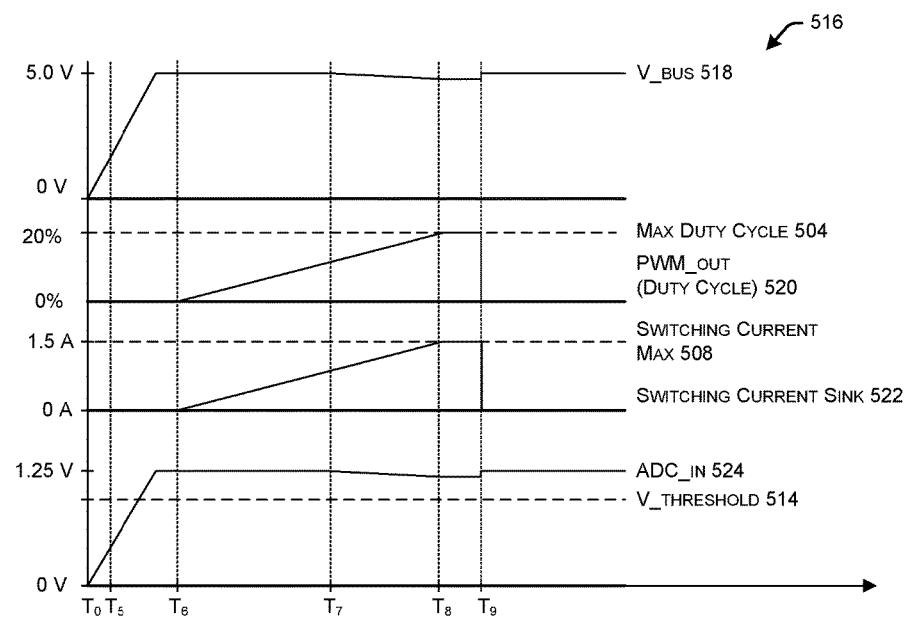
FIG. 5B is a conceptual timing diagram illustrating a process for detecting that a power capability of a power source is above a threshold amount using a switching current sink.

FIG. 5B is a conceptual timing diagram 516 illustrating a process for detecting that a power capability of a power source is above a threshold amount using a switching current sink. The specific illustrations in FIG. 5B are not intended to represent precise timings, voltages, and/or currents in a circuit, but are intended to illustrate the operations described herein. Similar names of the signals, voltages, and currents between FIGS. 5A and 5B correspond to similar operations; however, as described below, the power source represented in FIG. 5B is capable of supplying power above a threshold power level, which may indicate that the power source is capable of supplying power to an electronic device, such as the device 102 in FIG. 4.

At $T_0$, which may correspond to an initial time, the device 102 (e.g., in FIG. 4) is connected to a power source (capable of supplying a required power). At $T_5$, which may correspond to a time after $T_0$, the SoC 402 is energized and initiates operations to boot into the kernel to detect the capabilities of the power source.

At $T_6$, which may correspond to a time after $T_5$, a signal PWM_OUT 520 is output by the SoC 402 to initiate a current drawn by a switching current sink 522. In this case, the voltage of the bus V_BUS 518 is monitored by a voltage ADC_IN 524 input to the SoC 402.

Between $T_6$ and $T_7$, which may correspond to a time after $T_6$, the voltage represented by the V_BUS 518 remains steady at a nominal value (in this case, 5.0 V), while between $T_7$ and $T_8$ (which may which may correspond to a time after $T_7$), the increasing current draw of the switching current sink 522 may pull down the voltage of the V_BUS 518 (and correspondingly the ADC_IN 524). At $T_8$ the PWM_OUT 520 reaches a maximum duty cycle (e.g., the max duty cycle 504), which correspondingly controls the switching current sink 522 to draw a maximum current (e.g., the switching current max 508), and the voltage of the ADC_IN 524 steadies at a voltage above the V_THRESHOLD 514. At $T_9$, which may correspond to a time after $T_8$, the SoC 402 may discontinue the PWM_OUT 520, disconnecting the switching current sink 522, which sends the current to zero. Following $T_9$, the SoC 402 may continue a boot process of the device 102 in FIG. 4 without restrictions.

Figure 6A:
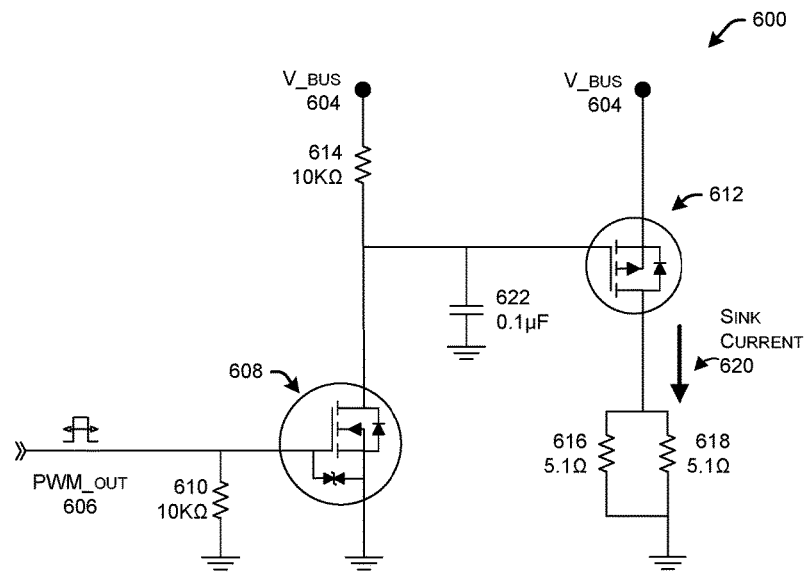
FIGS. 6A and 6B show an illustrative architecture of a device for detecting a power capability of a power source using a switching current sink.
Figure 6B:
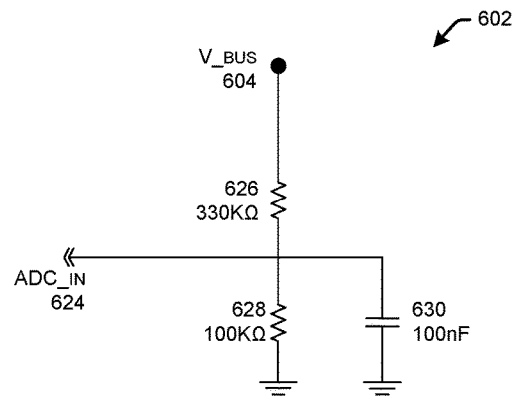

FIGS. 6A and 6B show illustrative architectures 600 and 602, respectively, of aspects of a device for detecting a power capability of a power source using a switching current sink. The components of the architectures 600 and 602 receive a voltage V_BUS 604, which may correspond to the voltage on the bus 110 of FIG. 4.

The architecture 600 receives a PWM_OUT 606, which may correspond to the PWM_OUT 404 of FIG. 4. The PWM_OUT 606 is input to a transistor 608, which may be coupled with a resistor 610 that is connected to ground. In some instances, the transistor 608 is an N-channel MOSFET, and may be implemented in a circuit with a component identified by a component number DMG1012T. In some instances, a drain of the transistor 608 may be connected to a gate of a transistor 612 and may be connected to a resistor 614 that is, in turn, connected to the V_BUS 604. In some instances, a "high" signal associated with the PWM_OUT 606 is approximately 1.8 V; accordingly, the transistor 608 and the resistor 614 function to invert the PWM_OUT 606, and to increase the voltage of the signal presented to the transistor 612.

The transistor 612 may correspond to a P-channel MOSFET that may be implemented in a circuit, and in some instances, the transistor 612 may be implemented with a component identified by a component number Si1401EDH-T1-GE3. A source terminal of the transistor 612 may be connected to the V_BUS 604 and a drain terminal of the transistor 612 may be connected to resistors 618 and 618. Thus, when the transistor 612 is turned on in response to the PWM_OUT 606 indicating a "high" signal, the transistor 612 generates a sink current 620 over the resistors 616 and

618. In some instances, the gate of the transistor 612 is connected to a capacitor 622.

As a duty cycle of the PWM_OUT 606 remains low (e.g., 1%), an average current across the resistors 616 and 618 (e.g., the sink current 620) will remain relatively low. As the duty cycle of the PWM_OUT 606 increases (e.g., 10%), the average current across the resistors 616 and 618 (e.g., the sink current 620) will increase until a maximum sink current determined by the SoC 402 (e.g., at a maximum duty cycle set by the SoC 402).

The architecture 602 in FIG. 6B illustrates an example of a voltage divider that provides a signal ADC_IN 624 to the SoC 402. For example, the ADC_IN 624 represents an analog voltage signal determined by the ratio of resistors 626 and 628, and the voltage V_BUS 604. Further, a capacitor 630 is included to filter a transient response of a voltage changes. In some instances, the ADC_IN 624 may correspond to the ADC_IN 406 of FIG. 4. In some instances, the voltage divider in the architecture 602 is provided to comply with voltage input requirements of the SoC 402. In some instances, the ADC_IN 624 is directly proportional to the V_BUS 604, and accordingly, a voltage drop in the V_BUS 624 generates a corresponding voltage drop in the ADC_IN 624.

A variety of devices may be used within the architectures 600 and 602. For example, components are not limited to those expressly described above, and various components may substituted or replaced for alternate implementations. For example, N-channel and P-channel MOSFETS may be used where appropriate. In some instances, various devices may be used, such as switching diodes, SCRs (silicon-controlled rectifiers), BJTs (bipolar junction transistors), JFETs (junction gate field-effect transistors), etc., according to current and/or voltage requirements of a specific implementation. Further, various resistor values and capacitance values illustrated in FIG. 6 are exemplary and the resistors and capacitors are not limited to those discussed above.

Figure 7:
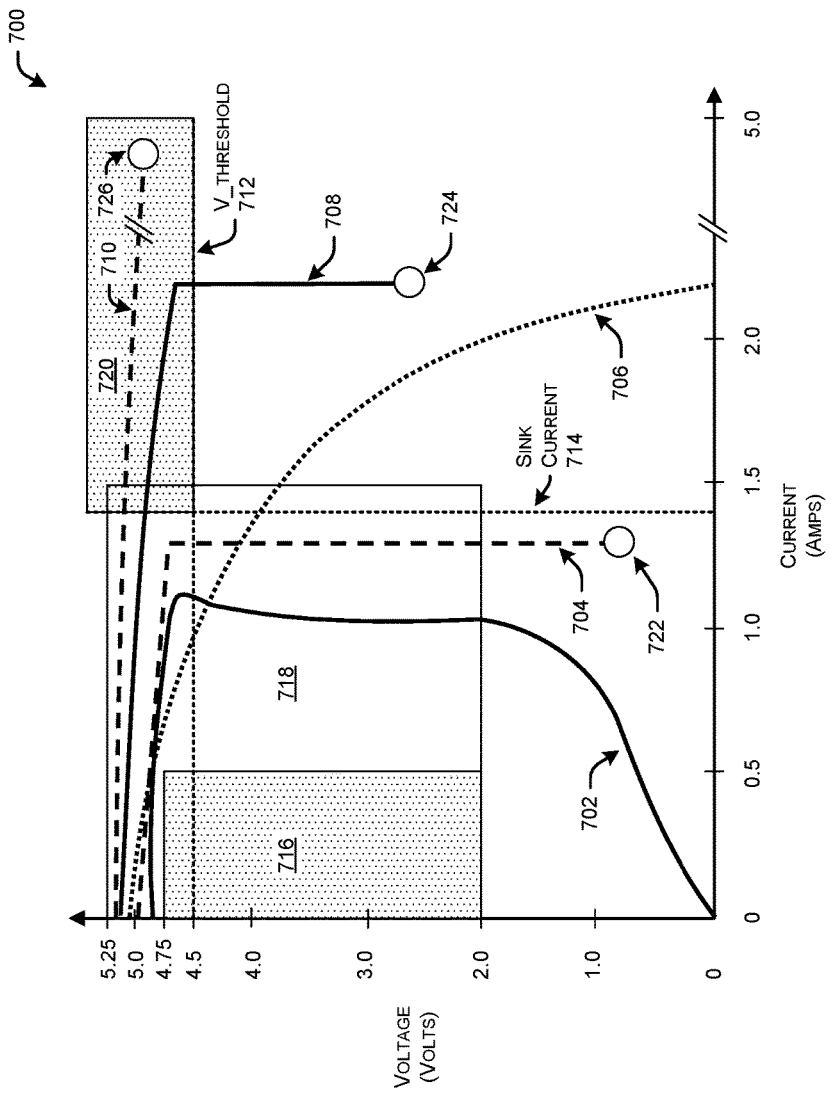
FIG. 7 is a graphic representation of various power curves for various power sources.

FIG. 7 is a graphic 700 representation of various power curves for various power sources. In the graphic 700, the x-axis represents an amount of current supplied by a particular power source, while the y-axis represents a voltage supplied by a particular power source. Thus, curves 702, 704, 706, 708, and 710 represent various voltage characteristics when supplying a corresponding current to a load. In some instances, the curves 702, 704, 706, 708, and 710 represent power sources in accordance with a specification associated with a standardized connector, such as a USB connector.

The graphic 700 includes a threshold voltage V_THRESHOLD 712 and a maximum sink current 714. In the graphic 700, the V_THRESHOLD 712 is set as 4.5 V, which may correspond to the threshold voltage monitored by the voltage monitor 116 in FIG. 1 and the V_THRESHOLD 204 in FIG. 2. The sink current 714 may correspond to a maximum current value sink by the ramping current sink 122 in FIG. 1, for example. It may be understood in the context of this disclosure that the values 4.5 V for the V_THRESHOLD 712 and 1.4 A for the sink current 714 are exemplary and may be set to other values according to various implementations.

Further, the graphic 700 includes various regions 716, 718, and 720, which correspond to general performance characteristics of various power sources. In some instances, a power source that operates within the region 716 (i.e., the region bounded between 2.0 V to 4.75 V and below 0.5 A) does not comply with a specification associated with a standardized connector, such as a USB connector. In some instances, a power source that operates in the region 718 (i.e., the region bounded between 2.0 V to 5.25 V and below 1.5 A, excluding the region 716) is suitable for operation as a dedicated charging port (DCP) (e.g., in accordance with a USB specification). In some instances, a power source that operates in the region 720 may be capable of supplying power to the device 102, for example. As illustrated in FIG. 7, the region 720 is the region above 4.5 V and above 1.4 A. Thus, in some instances, there may be overlap between the regions 718 and 720, for example.

Next, the curves 702, 704, 706, 708, and 710 are described with reference to the V_THRESHOLD 712 and the sink current 714, illustrating various behaviors when presented with various current loads.

The curve 702 represents a power source with a maximum current output of approximately 1.1 A. As the load increases beyond a power capacity of the power source, the current and voltage collapse to zero. As indicated in the graphic 700, the voltage of the curve 702 falls below the V_THRESHOLD 712, indicating that the power source represented by the curve 702 may be insufficient to power the device 102, for example.

The curve 704 represents a power source with a maximum current output of approximately 1.3 A. As the load increases beyond a power capacity of the power source, the current and voltage collapse, and the bus voltage is shut off at a point 722. The voltage of the curve 704 falls below the V_THRESHOLD 712, indicating that the power source represented by the curve 702 may be insufficient to power the device 102, for example.

The curve 706 represents a power source that gradually decreases in voltage as the current increases. While the power source represented by the curve 706 may supply a current beyond the sink current 714, the power source does so at a voltage below V_THRESHOLD 712, and thus, the power source represented by the curve 706 may be insufficient to power the device 102, for example.

The curve 708 represents a power source with a maximum current output of approximately 2.2 A (above the sink current 714) at approximately 4.75 V (above the V_THRESHOLD 712). Thus, the power source represented by the curve 708 may be sufficient to power the device 102. Further, the power source represented by the curve 708 may turn off at point 724 to prevent damage to a load or to the power source.

Similarly, the curve 710 represents a power source with a maximum current output of approximately 5.0 A (above the sink current 714) at approximately 5.0 V (above the V_THRESHOLD 712). Thus, the power source represented by the curve 710 may be sufficient to power the device 102. Further, the power source represented by the curve 710 may turn off at point 726 to prevent damage to a load or to the power source.

FIGS. 8-11 illustrate example processes in accordance with embodiments of the disclosure. Each process described herein is illustrated as a logical flow graph, each operation of which represents a sequence of operations that can be implemented in hardware, software, or a combination thereof. In the context of software, the operations represent computer-executable instructions stored on one or more computer-readable media that, when executed by one or more processors, perform the recited operations. Generally, computer-executable instructions include routines, programs, objects, components, data structures, and the like that perform particular functions or implement particular abstract data types.

The computer-readable media can include non-transitory computer-readable storage media, which can include hard drives, floppy diskettes, optical disks, CD-ROMs, DVDs, read-only memories (ROMs), random access memories (RAMs), EPROMs, EEPROMs, flash memory, magnetic or optical cards, solid-state memory devices, or other types of storage media suitable for storing electronic instructions. In addition, in some embodiments the computer-readable media can include a transitory computer-readable signal (in compressed or uncompressed form). Examples of computer-readable signals, whether modulated using a carrier or not, include, but are not limited to, signals that a computer system hosting or running a computer program can be configured to access, including signals downloaded through the Internet or other networks. Finally, the order in which the operations are described is not intended to be construed as a limitation, and any number of the described operations can be combined in any order and/or in parallel to implement the process.

Figure 8:
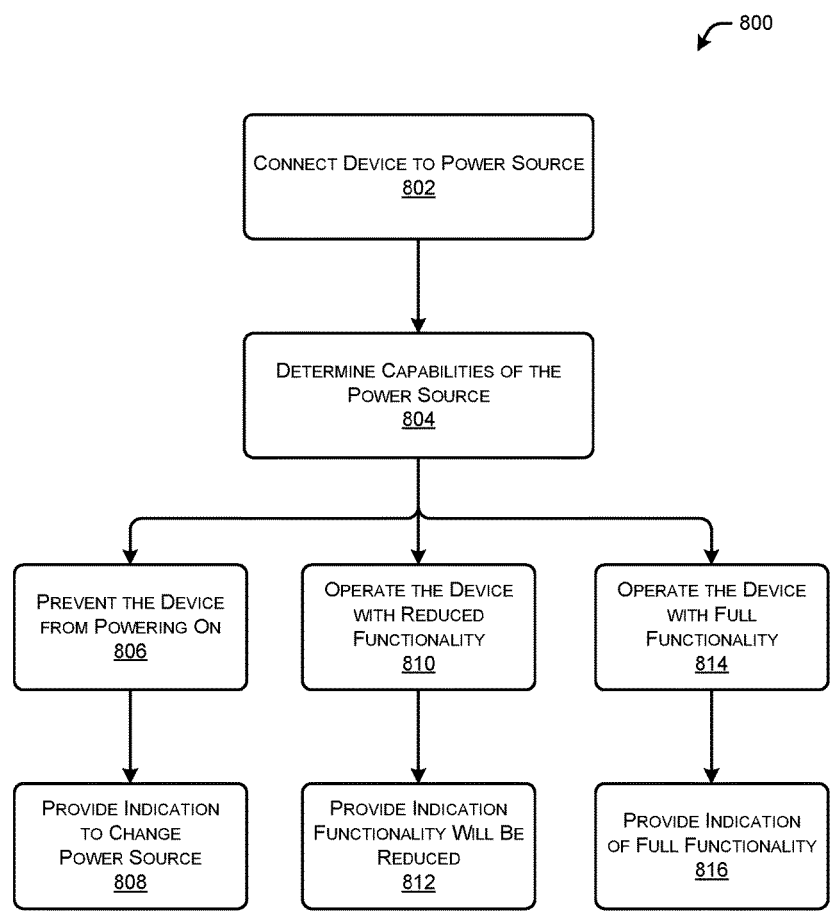
FIG. 8 illustrates a process for detecting a power capability of a power source and configuring a device based on an amount of available power.

FIG. 8 illustrates a process 800 for detecting a power capability of a power source and configuring a device based on an amount of available power. For example, aspects of the process 800 can be performed by the device 102, as illustrated in FIGS. 1 and 4.

At 802, the operation includes connecting a device to a power source. For example, the device (e.g., device 102) and the power source (e.g., power source 104) may include standardized connectors (e.g., connector 108) such that a power source with an unknown capacity may be coupled to the device 102.

At 804, the operation includes determining the capabilities of the power source. This operation is described in detail in connection with FIGS. 9 and 10 and throughout this disclosure. In some instances, the operation 804 may return a binary indication of whether the power source is sufficient or insufficient to provide the functionality of the device. In some instances, the operation 804 may return more precise information indicating a value that represents a maximum amount of power capable of being supplied by the power source.

At 806, the operation includes preventing the device from powering on. For example, it may be determined that the power source is insufficient to power one or more functions of the device. In some instances, the power source may be insufficient to power the operations to determine the capabilities of the power source.

At 808, the operation may include providing an indication to a user associated with the device, for example, to indicate to the user to change the power source. For example, an indication may include, but is not limited to, illuminating one or more lights (e.g., in a pattern or otherwise), proving an audible indication, displaying an indication (e.g., a message, symbol, image, etc.) via an interface (e.g., touchscreen, display, etc.) of the device 102, or sending a message to a computing device that the power source is insufficient (e.g., as an SMS/MMS (text message) or email).

At 810, the operation may include operating the device with reduced functionality. This operation is described in detail in connection with FIG. 11 and throughout this disclosure. In some instances, the power source may provide enough power to provide certain functions, but may be unable to provide power for instantaneous maximum draws of power (e.g., in the event of a burst of sound output at a high volume). For example, with reference to FIG. 7, a power source operating in the region 718 (excluding any overlap with the region 720, in such a case) may provide power to operate a device with reduced functionality. Thus, the device with a power source operating in region 718 may be operated by limiting a maximum volume, for example, to reduce instantaneous power surges.

At 812, the operation may include providing an indication that functionality will be reduced. For example, the operation 812 may include providing an indication to a user associated with the device, including but not limited to, illuminating one or more lights (e.g., in a pattern or otherwise), proving an audible indication, displaying an indication (e.g., a message, symbol, image, etc.) via an interface (e.g., touchscreen, display, etc.) of the device 102, or sending a message to a computing device that the power source is insufficient (e.g., as an SMS/MMS (text message) or email).

At 814, the device is operated with full functionality. With reference to FIG. 7, a power source operating in the region 720 may include a capability to satisfy the power requirements of a device, such as the device 102. For instance, the power source 104 may be able to provide sufficient power to receive user speech (e.g., audio commands) and generate audio data on which to perform voice recognition, transmit data to and/or from a network, output sound via a speaker, receive input via a touchscreen display, display content via a display, etc. In some instances, at 816, an indication may be provided that the device 102 may be operated with full functionality.

Figure 9:
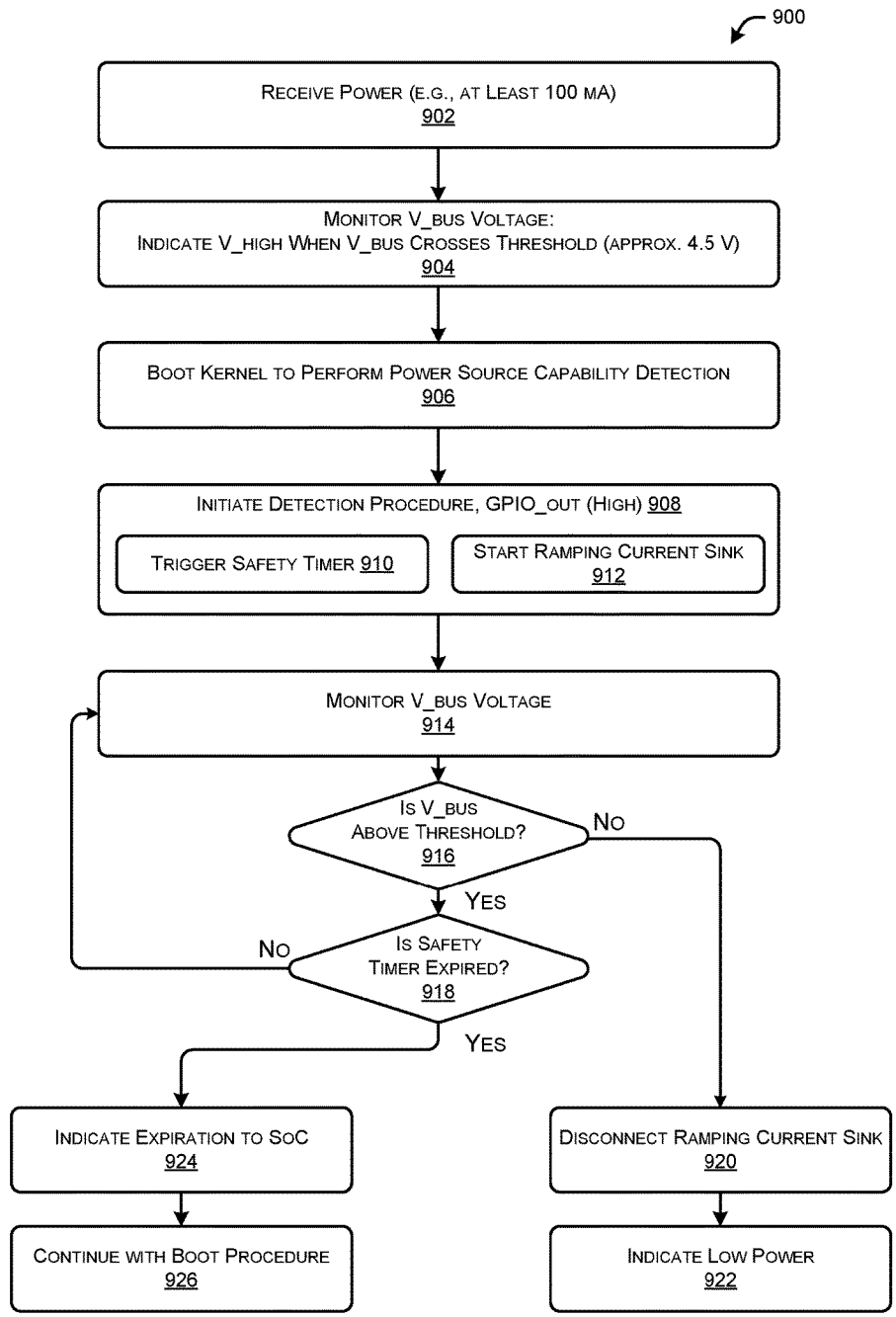
FIG. 9 illustrates a process for detecting a power capability of a power source using the illustrative ramping current sink architecture.

FIG. 9 illustrates a process 900 for detecting a power capability of a power source using the illustrative ramping current sink architecture. For example, aspects of the process 900 can be performed by the device 102, as illustrated in FIG. 1.

At 902, the operation includes receiving power at the device. For example, this operation may include connecting the device with a power source, as described herein. In some instances, when the power source is coupled with the device, the power source energizes the bus of the device (such as the bus 110), thereby supplying power to the device. In some instances, a minimum amount of current is required to initiate operations to determine the capabilities of a power source, such as 100 mA.

At 904, the operation includes monitoring the voltage of the bus, which may be referred to a "V_BUS." In some instances, this operation may be provided by the voltage monitor 116 of FIG. 1. Also, the operation 904 may be performed concurrently or in parallel with the operation 902. That is, the voltage V_BUS may be monitored when the device receives power. In some instances, the operation 904 includes providing an indication, such as "V_HIGH", indicating that the V_BUS is above a threshold voltage. In some instances, a threshold voltage may be approximately 4.5 V, as discussed herein.

At 906, the operation includes booting a kernel to perform the power source capability detection. For example, the kernel may be a program or operating system on the SoC 114 that requires a minimal amount of power to operate, but also provides minimal functions. One such function is performed in operation 908, which is to initiate the detection procedure by outputting a GPIO_OUT signal as a "high" signal. This operation 908 may trigger an operation 910, which may include triggering a safety timer. Further, the operation 908 may trigger an operation 912, which may include starting a ramping current sink, which may represent a load expected by the device 102. For example, the ramping current sink may increase from zero current to a maximum current, wherein the maximum current represents a maximum power draw of the device 102. In some instances, the safety timer may allow the operation of the ramping current sink to proceed for a period of time defined by the safety timer, to prevent overheating and/or to reduce a need for a heat sink in this aspect of the device 102.

At 914, the operation includes monitoring the V_BUS voltage, which may change as the ramping current sink progresses though its operation. For example, as a current draw increases, the device may experience a drop in the V_BUS voltage.

At 916, the operation includes determining if the V_BUS voltage is above a voltage threshold. If "yes" in the operation 916, the V_BUS is above the threshold, and the process 900 continues to operation 918, which includes determining if the safety timer is expired. If the safety timer has not expired ("no" in the operation 918), the process 900 continues monitoring the V_BUS voltage (i.e., in the operation 914) and checking to determine if the V_BUS voltage is above a threshold voltage (i.e., in the operation 916).

If the V_BUS voltage falls below the voltage threshold any time before the safety timer expires, the operation (i.e., "no" in operation 916) continues to an operation 920 to disconnect the ramping current sink. Following the operation 920, operation 922 includes indicating that the power source is low-powered. For example, in some instances, the ramping current sink may draw 7 watts at peak power consumption, while a power source may only supply 5 watts of power.

In some instances, the operation 922 may include providing the indication to the SoC 114 in the device 102. For example, the operation 922 may include triggering the signal GPIO_IN 136 to the SoC 114. In some instances, the operation 922 may include providing an indication to a user in the form of lights, audio, a visual message (e.g., text, icons, symbols, etc.), an electronic message, or by other means, that the power source is not capable of supplying power required for the operation of the device.

Returning to the operation 918, if the safety timer has expired (i.e., "yes" in the operation 918) the process moves to operation 924, which includes providing an indication to the SoC 114 that the safety timer has expired and that the capability detection operation has completed. At 926, the operation includes continuing with a boot procedure (i.e., directed by the SoC 114), which may include booting a full operating system of the device 102. In some instances, this operation may include providing an indication to a user in the form of lights, audio, an electronic message, or by other means, that the power source is capable of supplying power for the operation of the device.

Figure 10:
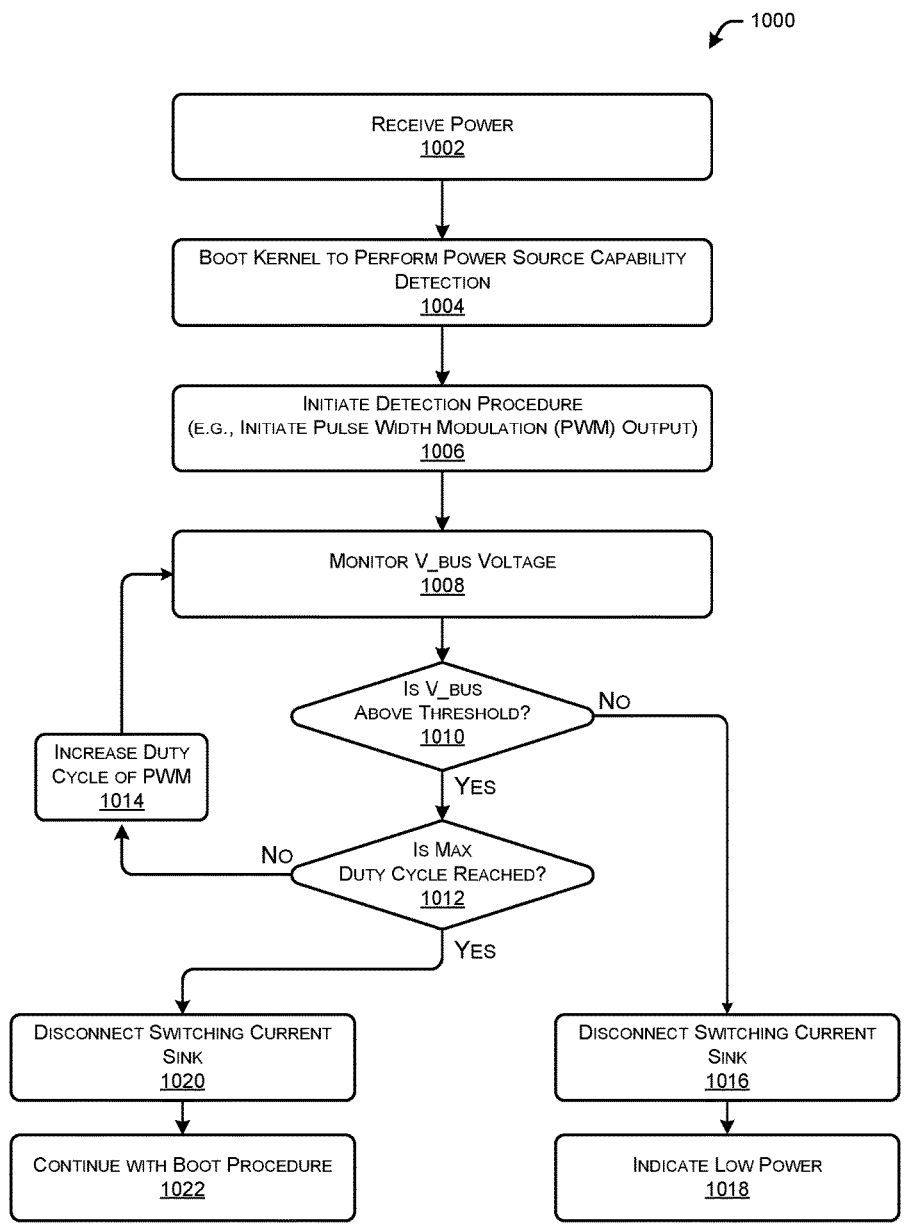
FIG. 10 illustrates a process for detecting a power capability of a power source using the illustrative switching current sink architecture.

FIG. 10 illustrates a process for detecting a power capability of a power source using the illustrative switching current sink architecture. For example, aspects of the process 1000 can be performed by the device 102, as illustrated in FIG. 4.

At 1002, the operation includes receiving power at the device. For example, this operation may include connecting the device with a power source, as described herein. In some instances, when the power source is coupled with the device, the power source energizes the bus of the device (such as the bus 110), thereby supplying power to the device. In some instances, a minimum amount of current is required to initiate operations to determine the capabilities of a power source, such as 100 mA.

At 1004, the operation includes booting a kernel to perform the power source capability detection. For example, the kernel may be a program or operating system on the SoC 402 that requires a minimal amount of power to operate, but also provides minimal functions. One such function is performed in operation 1006, which is to initiate the detection procedure by initiating a pulse width modulation (PWM) output, which in turn may begin sinking current at a switching current sink, which may represent a load expected by the device 102. For example, the switching current sink may increase from zero current to a maximum current, wherein the maximum current represents a maximum power draw of the device 102. In some instances, a frequency of the PWM may be on the order of 8 kHz, 16 kHz, 32 kHz, or any other frequency.

At 1008, the operation includes monitoring the V_BUS voltage, which may change as the switching current sink progresses though its operation. For example, as a current draw increases, the device may experience a drop in the V_BUS voltage. In some instances, the V_BUS voltage is received via an analog-to-digital converter (ADC) that inputs a divided voltage of the V_BUS to the SoC.

At 1010, the operation includes determining if the voltage V_BUS is above a threshold. In some instances, the operation 1010 may include reading the analog voltage presented at an ADC input, converting the voltage to a digital value, and comparing the digital value with a value corresponding to a threshold voltage of the V_BUS that, when the V_BUS falls below, indicates that a power source is an insufficient power source. In some instances, the threshold voltage may be set by the SoC and is not dependent on hardware. That is, any voltage may be set to correspond to a threshold voltage.

At 1012, the operation includes determining whether a maximum duty cycle is reached. In general, the operation 1000 increases a duty cycle incrementally and finishes processing when a maximum duty cycle is reached. If the maximum duty cycle is not reached ("No", operation 1012), the operation continues to operation 1014, where the duty cycle of the PWM is increased (e.g., from 1% to 2%, from 2% to 3%, etc.). In some instances, any sequence or pattern of varying a duty cycle of the PWM may be used. Next, the operation continues to the operation 1008, where the voltage of the V_BUS is monitored, and to the operation 1010 where it is determined whether the V_BUS is above the threshold. That is, the voltage of the V_BUS may be monitored for each duty cycle set by the SoC. Further, in some instances, the PWM output by the SoC may hold a duty cycle for a period of time or for a number of cycles. For example, considering a case where PWM signal operating at 16 kHz is held at a constant duty cycle for 2 ms, the PWM signal may hold at a particular duty cycle for 32 cycles before a voltage of the V_BUS stabilizes in response to the particular duty cycle and the voltage is measured at the ADC.

If the voltage of the V_BUS is not above the threshold ("No", operation 1010), the process 1000 proceeds to operation 1016 where the switching current sink is disconnected (e.g., by ceasing output of the PWM), and to operation 1018, where an indication that the power source is underpowered is provided. In some instances, the operation 1018 may include providing an indication to a user in the form of lights, audio, a visual message (e.g., text, icons, symbols, etc.), an electronic message, or by other means, that the power source is not capable of supplying power required for the operation of the device.

After cycling through a number of duty cycles and monitoring the voltage of the V_BUS at each particular duty cycle, the operation 1012 may include determining that a maximum duty cycle has been reached ("Yes", operation 1012). Accordingly the process moves to operation 1020, where the switching current sink is disconnected, which may include setting the PWM signal to "low." At 1022, the operation includes continuing with a boot procedure (i.e., directed by the SoC 402), which may include booting a full operating system of the device 102. In some instances, this operation may include providing an indication to a user in the form of lights, audio, an electronic message, or by other means, that the power source is capable of supplying power for the operation of the device.

Figure 11:
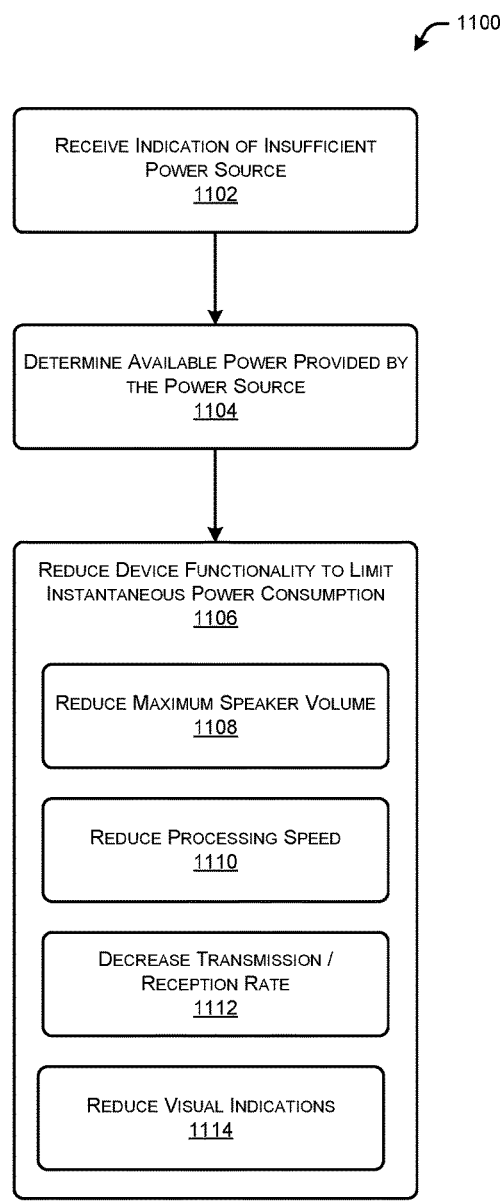
FIG. 11 illustrates a process for operating a device with reduced functionality to limit instantaneous power consumption.

FIG. 11 illustrates a process for operating a device with reduced functionality to limit instantaneous power consumption. For example, aspects of the process 1100 can be performed by the device 102, as illustrated in FIGS. 1 and 4.

At 1102, the operation includes receiving an indication that a power source connected to the device is insufficient to provide all the functionalities of the device. For example, the SoC 114 may receive the signal GPIO_IN 136 from the voltage monitor 116. In some instances, the operation 1102 may correspond with the operation 922 in FIG. 9. In some instances, the operation 1102 may correspond with the operation 1018 in FIG. 10.

At 1104, the operation includes determining an available power provided by the power source connected to the device. In some instances, this operation includes determining an available power (e.g., in Watts) capable of being supplied by the power source. In some instances, the device may include a current monitor to measure the current provided by the power source when the V_BUS falls below a voltage threshold. In some instances, the device may infer the available power by estimating the current in the ramping current sink at the time of failure.

For example, the SoC 114 may record a time between outputting the GPIO_OUT (e.g., in the operation 908) and receiving the indication of the low power (e.g., as the GPIO_IN in the operation 922). Based on the amount of time elapsed, the SoC 114 can determine a current at which the power source failed. For example, the SoC 114 may utilize information including, but not limited to, a ramping period of a ramping current sink, a time period elapsed before receiving a low power indication (e.g., GPIO_IN 136), a starting current of the ramping current sink, an ending current of the ramping current sink, and a shape of the ramping associated with the ramping current sink (e.g., linear, curved, etc.), a nominal voltage of the power source, the threshold voltage for triggering the GPIO_IN, and signal propagation delays in the circuit. For example, in a case where the ramping period is 10 ms (i.e., a time between $T_7$ and $T_9$ in FIG. 2B), a starting current is 0 A, a maximum current is 2 A, the ramp is linear between the starting current and the maximum current, the GPIO_IN was received 5 ms after GPIO_OUT was triggered, and the threshold voltage is 4.5 V, the SoC may determine and/or infer that the particular power source may supply 4.5 W of power. In other words, in some instances, the SoC 114 may infer a capacity of a power source by interpolating within the ramping current sink operation. Thus, the operation 1104 may provide some resolution of an available amount of power to be supplied by an unknown power source.

In some instances, the SoC 402 may determine an available power provided by the power source connected to the device based in part on the voltage of the bus at the time of voltage collapse (e.g., associated with ADC_IN) and a duty cycle of the PWM at the time of voltage collapse. For example, a 10% duty cycle may correspond with a particular sink current, such as 1 A. If the ADC indicates that a voltage of the bus was 4 V at the time of collapse, an available amount of power of the power source may be on the order of 4 W.

At 1106, after determining an amount of available power provided by the power source, the operation may reduce the functionality of the device to limit an instantaneous power consumption of the device. In some instances, one or more functions of the device may be altered to reduce a power consumption of the device. In some instances, the operation 1106 can include dynamically altering or limiting the functions of the device. For example, the operation 1106 (and those described below) can be controlled via one or more (software) drivers associated with the various components of the device.

For example, at 1108, the operation may include reducing a maximum speaker volume. In some instances, the operation may place an upper limit with respect to a volume to reduce power consumed by a (hardware) speaker driver. For example, a (software) speaker driver may be configured to restrict a maximum volume to be output by a speaker of the device. At 1110, the operation may include reducing a processing speed of a processor. At 1112, the operation may include decreasing a transmission and/or reception rate of wired or wireless data transferred to and/or from the device. In some instances, the operation 1114 may include reducing visual indications provided by the device, such as decreasing or omitting a brightness of light provided by the device. In some instances, one or more of the operations 1106, 1108, 1110, 1112, and 1114 may be performed to constrain an instantaneous power consumed by the device below a maximum power capacity of a power source. Without the operations 1106, 1108, 1110, 1112, and/or 1114, power draws beyond a capacity of a power source may lead to system crashes and/or reboots during the operation of a device, which leads to a poor user experience.

Figure 12:
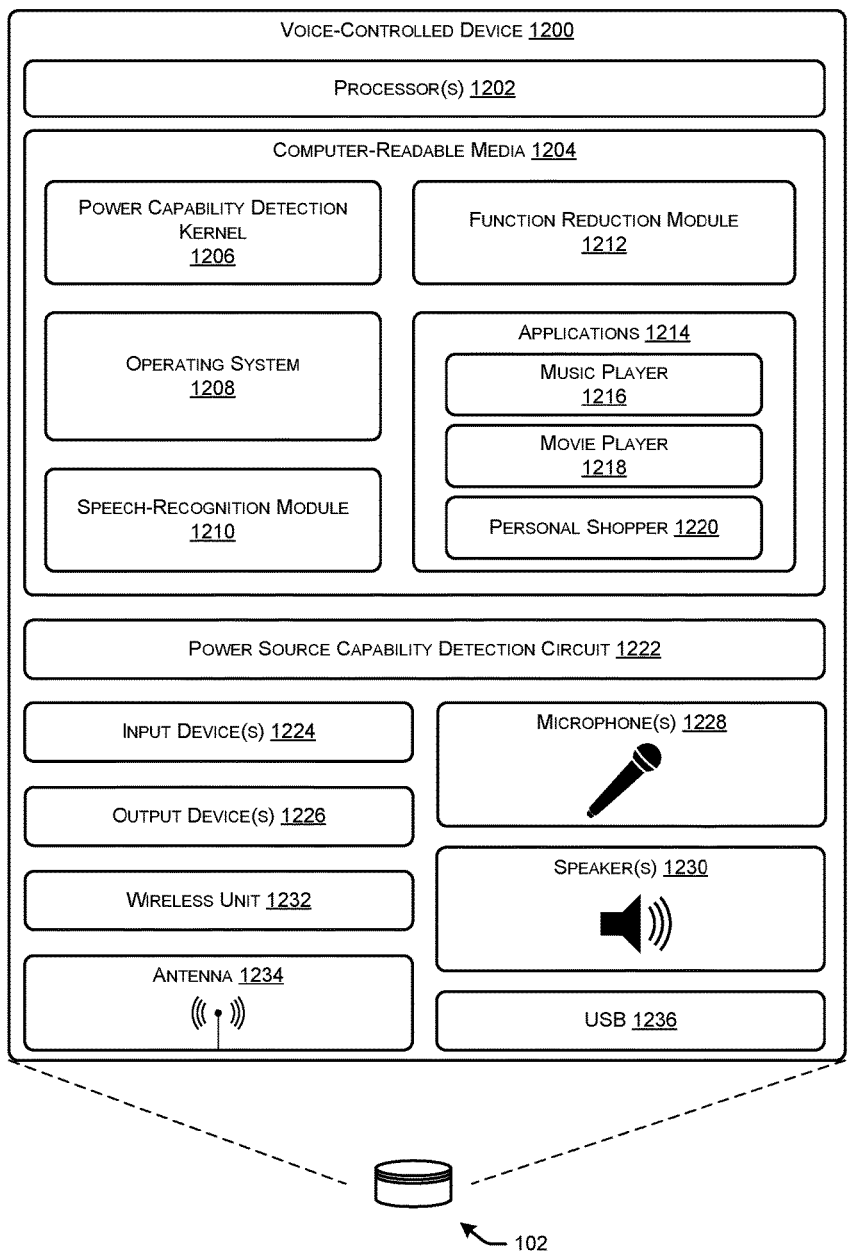
FIG. 12 shows a functional block diagram of selected components of a device implementing the power source capability detection of the present disclosure.

FIG. 12 shows a functional block diagram of selected components of a device implementing the power source capability detection of the present disclosure, such as one illustrated in FIGS. 1 and 4.

The device 102 may be implemented as a voice-controlled device 1200 that is relatively simple in terms of functional capabilities with limited input/output components, memory, and processing capabilities. For instance, the voice-controlled device 1200 may not have a keyboard, keypad, or other form of mechanical input. The device 1200 may also not have a display (other than simple lights, for instance) or touch screen to facilitate visual presentation and user touch input. Instead, the device 1200 may be implemented with the ability to receive and output audio, a network interface (wireless or wire-based), power, and processing/memory capabilities. In certain implementations, a limited set of one or more input components may be employed (e.g., a dedicated button to initiate a configuration, power on/off, etc.). Nonetheless, the primary and potentially only mode of user interaction with the device 1200 is through voice input and audible output. In some instances, the device 1200 may simply comprise a microphone, a power source (e.g., a battery), and functionality for sending captured audio signals to another device. In some instances, the device 1200 may not include an internal power source, such as a battery, and may utilize an external power source as the only source of power.

The voice-controlled device 1200 may also be implemented as a mobile device such as a smart phone or personal digital assistant. The mobile device may include a touch-sensitive display screen and various buttons for providing input as well as additional functionality such as the ability to send and receive telephone calls. Alternative implementations of the voice-controlled device 1200 may also include configuration as a personal computer. The personal computer may include a keyboard, a mouse, a display screen, and any other hardware or functionality that is typically found on a desktop, notebook, netbook, or other personal computing devices. The devices describe above are merely examples and not intended to be limiting, as the techniques described in this disclosure may be used in essentially any device that has an ability to recognize speech input or other types of natural language input.

In the illustrated implementation, the voice-controlled device 1200 includes one or more processors 1202 and computer-readable media 1204. In some implementations, the processors(s) 1202 may include a central processing unit (CPU), a graphics processing unit (GPU), both CPU and GPU, a microprocessor, a digital signal processor or other processing units or components known in the art. Alternatively, or in addition, the functionally described herein can be performed, at least in part, by one or more hardware logic components. For example, and without limitation, illustrative types of hardware logic components that can be used include field-programmable gate arrays (FPGAs), application-specific integrated circuits (ASICs), application-specific standard products (ASSPs), system-on-a-chip systems (SOCs), complex programmable logic devices (CPLDs), etc. Additionally, each of the processor(s) 1202 may possess its own local memory, which also may store program modules, program data, and/or one or more operating systems.

The computer-readable media 1204 may include volatile and nonvolatile memory, removable and non-removable media implemented in any method or technology for storage of information, such as computer-readable instructions, data structures, program modules, or other data. Such memory includes, but is not limited to, RAM, ROM, EEPROM, flash memory or other memory technology, CD-ROM, digital versatile discs (DVD) or other optical storage, magnetic cassettes, magnetic tape, magnetic disk storage or other magnetic storage devices, RAID storage systems, or any other medium which can be used to store the desired information and which can be accessed by a computing device. The computer-readable media 1204 may be implemented as computer-readable storage media ("CRSM"), which may be any available physical media accessible by the processor(s) 1202 to execute instructions stored on the computer-readable media 1204. In one basic implementation, CRSM may include random access memory ("RAM") and Flash memory. In other implementations, CRSM may include, but is not limited to, read-only memory ("ROM"), electrically erasable programmable read-only memory ("EEPROM"), or any other tangible medium which can be used to store the desired information and which can be accessed by the processor(s) 1202.

Several modules such as instruction, data stores, and so forth may be stored within the computer-readable media 1204 and configured to execute on the processor(s) 1202. A few example functional modules are shown as applications stored in the computer-readable media 1204 and executed on the processor(s) 1202, although the same functionality may alternatively be implemented in hardware, firmware, or as a system on a chip (SOC). In some instances, the SoC 114 of FIG. 1 (or the SoC 402 of FIG. 4, for example) may be operated separately from the processors 1202 and the computer-readable media 1204 to provide discrete functionality for the device capability detection operations, as describe herein.

A power capability detection kernel 1206 may be configured to manage hardware and services within and coupled to the device 1200 to detect a power source coupled to the device 1200. In some instances, the power capability detection kernel 1206 may be provided separately on the SoC 114 (or 402), and may be initiated upon first powering the device 1200.

An operating system module 1208 may be configured to manage hardware and services within and coupled to the device 1200 for the benefit of other modules. In some instances, the operating system module 1208 is loaded and/or initiated in response to a determination by the power capability detection kernel 1206 that a power source is capable of providing power for some of all of the functions of the device 1200. The device 1200 may further include, in some instances, a speech-recognition module 1210 that employs any number of conventional speech processing techniques such as use of speech recognition, natural-language understanding, and extensive lexicons to interpret voice input. In some instances, the speech-recognition module 1210 may simply be programmed to identify the user uttering a predefined word or phrase (i.e., a "wake word"), after which the device 1200 may begin uploading audio signals to a network device for more robust speech-recognition processing. In other examples, the device 1200 itself may, for example, identify voice commands from users and may provide indications of these commands to the network device.

The voice-controlled device 1200 may also include a function reduction module 1212 that may reduce the functionality of one or more functions of the device to keep an instantaneous power consumption of the device below a maximum available provided by a power source.

Further, the voice-controlled device 1200 may include a plurality of applications 1214 stored in the computer-readable media 1204 or otherwise accessible to the device 1200. In this implementation, the applications 1214 are a music player 1216, a movie player 1218, and a personal shopper 1220. However, the voice-controlled device 1200 may include any number or type of applications and is not limited to the specific examples shown here. The music player 1216 may be configured to play songs or other audio files. The movie player 1218 may be configured to play movies or other audio visual media. The personal shopper 1220 may be configured to assist a user in purchasing items from web-based merchants.

In some instances, the voice-controlled device may include a power source capability detection circuit 1222, which may correspond to the circuits described in connection with FIGS. 1, 3, 4, and 6.

Generally, the voice-controlled device 1200 has input devices 1224 and output devices 1226. The input devices 1224 may include a keyboard, keypad, mouse, touch screen, joystick, control buttons, etc. In some implementations, one or more microphones 1228 may function as input devices 1224 to receive audio input, such as user voice input. The output devices 1226 may include a display, a light element (e.g., LED), a vibrator to create haptic sensations, or the like. In some implementations, one or more speakers 1230 may function as output devices 1226 to output audio sounds.

A user may interact with the voice-controlled device 1200 by speaking to it, and the one or more microphone(s) 1228 captures the user's speech. The voice-controlled device 1200 can communicate back to the user by emitting audible statements through one or more speakers 1230. In this manner, the user can interact with the voice-controlled device 1200 solely through speech, without use of a keyboard or display.

The voice-controlled device 1200 may further include a wireless unit 1232 coupled to an antenna 1234 to facilitate a wireless connection to a network. The wireless unit 1232 may implement one or more of various wireless technologies, such as Wi-Fi, Bluetooth®, RF, and so on. A USB port 1234 may further be provided as a connection with a power source, as described herein. Further, the USB port 1236 may be provided as part of the device 1200 to facilitate a wired connection to a network, or a plug-in network device that communicates with other wireless networks. In addition to the USB port 1236, or as an alternative thereto, other forms of wired connections may be employed, such as a broadband connection.

Accordingly, when implemented as the primarily-voice-operated device 1200, there may be no input devices, such as navigation buttons, keypads, joysticks, keyboards, touch screens, and the like other than the microphone(s) 1228. Further, there may be no output such as a display for text or graphical output. The speaker(s) 1230 may be the main output device. In one implementation, the voice-controlled device 1200 may include non-input control mechanisms, such as basic volume control button(s) for increasing/decreasing volume, as well as power and reset buttons. There may also be a simple light element (e.g., LED) to indicate a state such as, for example, when power is on.

Accordingly, the device 1200 may be implemented as an aesthetically appealing device with smooth and rounded surfaces, with one or more apertures for passage of sound waves. The device 1200 may merely have a power cord and optionally a wired interface (e.g., broadband, USB, etc.). As a result, the device 1200 may be generally produced at a low cost. Once plugged in, the device may automatically self-configure, or with slight aid of the user, and be ready to use. In other implementations, other I/O components may be added to this basic model, such as specialty buttons, a keypad, display, and the like.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

What is claimed is:

1. A device comprising:
    a controller to generate a signal having a first duty cycle at a first time and having a second duty cycle at a second time, the second duty cycle higher than the first duty cycle;
    a switching current sink to receive the signal and to draw a first current amount from a power source connected to the device at the first time and to draw a second current amount at the second time, the second current amount being higher than the first current amount; and
    a voltage divider to provide voltage information of a power bus of the device to the controller;
    wherein the controller ceases generating the signal based on at least one of:
        determining that the second duty cycle reaches a threshold duty cycle; or
        receiving, from the voltage divider, the voltage information indicating at least that a voltage of the power bus is below a voltage threshold.

2. The device of claim 1, wherein the controller is configured to boot a kernel that includes operating instructions to determine a capacity of the power source, the boot performed in response to a coupling of the power source to the device.

3. The device of claim 1, wherein the controller ceases generating the signal based at least in part on determining that the second duty cycle reaches the threshold duty cycle, and wherein the controller is further to:
    determine that a power source capability of the power source meets a threshold power level.

4. The device of claim 1, wherein the controller ceases generating the signal based at least in part on receiving, from the voltage divider, the voltage information indicating that the voltage of the power bus is below the voltage threshold, and wherein the controller is further to:
    determine a duty cycle of the signal associated with the voltage information indicating that the voltage of the power bus is below the voltage threshold; and
    determine, based at least in part on the duty cycle, a power source capability of the power source.

5. The device of claim 1, wherein the first current amount is based at least in part on the first duty cycle and wherein the second current amount is based at least in part on the second duty cycle.

6. The device of claim 1, wherein the threshold duty cycle is based at least in part on a power level associated with a test load.

7. The device of claim 1, wherein the voltage divider provides the voltage information as an analog signal to an analog-to-digital input of the controller.

8. The device of claim 1, wherein the switching current sink includes at least one transistor and a resistor, the at least one transistor configured to provide a current to the resistor based at least in part on the signal.

9. The device of claim 1, wherein the signal includes at least one of:
    a pulse-width modulation signal;
    a fixed-width modulation signal; or
    a pulse density modulation signal.

10. A device comprising:
    a controller to:
        generate a signal having a first duty cycle at a first time and having a second duty cycle at a second time; and
        receive voltage information of a power bus of the device; and
    a switching current sink to receive the signal and to draw a first current amount from a power source connected to the device at the first time and to draw a second current amount at the second time, the second current amount being higher than the first current amount;
    wherein the controller ceases generating the signal based on at least one of:
        a determination that the second duty cycle reaches a threshold duty cycle; or
        a receipt of the voltage information indicative of a voltage of the power bus being below a voltage threshold.

11. The device of claim 10, wherein the controller is configured to boot a kernel that includes operating instructions to determine a capacity of the power source, the boot performed in response to a coupling of the power source to the device.

12. The device of claim 10, wherein the controller ceases generating the signal based at least in part on determining that the second duty cycle reaches the threshold duty cycle, the controller configured to:
    determine that a power source capability of the power source meets a threshold power level.

13. The device of claim 10, wherein the controller ceases generating the signal based at least in part on receiving the voltage information indicating that the voltage of the power bus is below the voltage threshold, the controller configured to:

determine a duty cycle of the signal associated with the voltage information indicating that the voltage of the power bus is below the voltage threshold; and determine, based at least in part on the duty cycle, a power source capability of the power source.

14. The device of claim 10, wherein the controller is further to:

determine a power capacity of the power source; and disable one or more functions of the device based in part on the power capacity of the power source.

15. The device of claim 10, wherein the device does not include a battery.

16. A method comprising:

receiving a first voltage at a power bus of a device, the first voltage provided by a power source coupled to the device;

generating, by the device, a signal having a first duty cycle at a first time and having a second duty cycle at a second time;

drawing, by the device, a first current from the power source at the first time;

drawing, by the device, a second current from the power source at the second time;

monitoring, by the device, a second voltage of the power bus at a third time between the first time and the second time; and ceasing to generate the signal upon one of:

determining that the second duty cycle reaches a threshold duty cycle; or determining that the second voltage is below a voltage threshold.

17. The method of claim 16, the method further comprising booting a kernel at a controller of the device that includes operating instructions to determine a capacity of the power source, the booting performed in response to a coupling of the power source to the device.

18. The method of claim 16, the method further comprising:

determining that the second voltage is below the voltage threshold;

determining a duty cycle of the signal associated with the voltage threshold;

determining a power capacity of the power source based at least in part on the duty cycle and the voltage threshold; and determining that the power capacity of the power source is below a power level threshold to power the device.

19. The method of claim 16, the method further comprising:

determining a power capacity of the power source; and selectively disabling one or more functions of the device based in part on the power capacity of the power source.

20. The method of claim 16, further comprising:

determining that a voltage of the power bus did not fall below the voltage threshold;

determining that a power capacity of the power source is above a power level threshold to power the device; and booting an operating system of the device.

* * * * *